(12) United States Patent
Saito et al.

(10) Patent No.: US 12,463,028 B2
(45) Date of Patent: Nov. 4, 2025

(54) METHOD OF PROCESSING WAFER

(71) Applicant: DISCO CORPORATION, Tokyo (JP)

(72) Inventors: Yoshinobu Saito, Tokyo (JP); Jonghyun Ryu, Tokyo (JP); Yoshikuni Migiyama, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 667 days.

(21) Appl. No.: 17/804,185

(22) Filed: May 26, 2022

(65) Prior Publication Data

US 2022/0384175 A1    Dec. 1, 2022

(30) Foreign Application Priority Data

Jun. 1, 2021    (JP) .................................. 2021-092048

(51) Int. Cl.
*B32B 43/00*    (2006.01)
*H01L 21/02*    (2006.01)
(Continued)

(52) U.S. Cl.
CPC .. *H01L 21/02013* (2013.01); *H01L 21/67742* (2013.01); *H01L 21/67763* (2013.01)

(58) Field of Classification Search
CPC ............. H01L 21/02013; H01L 21/304; H01L 21/67742; H01L 21/67763;
(Continued)

(56) References Cited

U.S. PATENT DOCUMENTS 5,238,876 A * 8/1993 Takeuchi ............. B28D 5/0052
438/464
7,598,120 B2 * 10/2009 Yamamoto ........ H01L 21/67132
438/106
(Continued)

FOREIGN PATENT DOCUMENTS

CN    101683749 A  * 3/2010
CN    107305863 A  * 10/2017 ........... B23K 26/032
(Continued)

OTHER PUBLICATIONS

Office Action issued in counterpart Singapore patent application No. 10202205311Y, dated Oct. 11, 2023.
(Continued)

*Primary Examiner* — Ajay Ojha
*Assistant Examiner* — Tsz K Chiu
(74) *Attorney, Agent, or Firm* — Greer, Burns & Crain, Ltd

(57) ABSTRACT

A method of processing a wafer includes preparing a ring-shaped frame having an opening for accommodating a wafer therein, preparing a wafer having a protrusive ring-shaped stiffener on a reverse side thereof in an outer circumferential excess region thereof, producing a frame unit by affixing a tape to the frame and the reverse side of the wafer, capturing an image of the ring-shaped stiffener and setting a center of an inner circumferential circle of the ring-shaped stiffener on the basis of the captured image, rotating the frame unit around the center of the inner circumferential circle of the ring-shaped stiffener to cut the wafer along the inner circumferential circle of the ring-shaped stiffener, and removing the ring-shaped stiffener severed from the frame unit.

18 Claims, 22 Drawing Sheets

(51) Int. Cl.
*H01L 21/67* (2006.01)
*H01L 21/677* (2006.01)

(58) Field of Classification Search
CPC ......... H01L 21/67132; H01L 21/67706; H01L 21/67718; H01L 21/681; H01L 21/6838; H01L 21/68707; H01L 21/78; H01L 21/67766; H01L 21/67092; H01L 21/67259; H01L 21/67288; H01L 21/6836; H01L 21/687; H01L 2221/68327; H01L 2221/6834; H01L 21/30625; H01L 21/6835; B23K 26/38; B23K 26/402; B23K 26/364; B28D 5/00; B28D 5/0058; B28D 5/0082; B24B 27/06
See application file for complete search history.

(56) References Cited

U.S. PATENT DOCUMENTS

| | | | |
|---|---|---|---|
| 11,276,588 B2* | 3/2022 | Sekiya | H01L 21/687 |
| 11,387,133 B2* | 7/2022 | Nakamura | H01L 21/78 |
| 11,764,085 B2* | 9/2023 | Masuda | H01L 21/67132 |
| | | | 156/538 |
| 2003/0133762 A1* | 7/2003 | Yamamoto | H01L 21/67748 |
| | | | 406/198 |
| 2005/0070072 A1* | 3/2005 | Priewasser | H01L 21/302 |
| | | | 438/460 |
| 2005/0236114 A1* | 10/2005 | Yanagita | H01L 21/67745 |
| | | | 156/391 |
| 2007/0181245 A1* | 8/2007 | Kaneshima | B29C 63/02 |
| | | | 156/499 |
| 2008/0044258 A1* | 2/2008 | Akechi | H01L 21/6835 |
| | | | 414/222.01 |
| 2009/0011572 A1* | 1/2009 | Kaneko | B23K 26/0853 |
| | | | 134/1.2 |
| 2009/0057841 A1* | 3/2009 | Sekiya | H01L 23/544 |
| | | | 257/E23.179 |
| 2010/0055877 A1* | 3/2010 | Kajiyama | H01L 21/78 |
| | | | 438/464 |
| 2010/0127726 A1* | 5/2010 | Abe | G01R 31/31905 |
| | | | 324/756.03 |
| 2010/0300612 A1 | 12/2010 | Yamamoto et al. | |
| 2011/0297329 A1* | 12/2011 | Canale | B32B 43/006 |
| | | | 156/756 |
| 2015/0251902 A1* | 9/2015 | Bernales | B81C 1/00531 |
| | | | 438/50 |
| 2015/0332909 A1* | 11/2015 | Suzuki | B24B 7/228 |
| | | | 438/691 |
| 2017/0287703 A1* | 10/2017 | Amano | H01L 21/67253 |
| 2017/0301571 A1 | 10/2017 | Tsuchiya et al. | |
| 2020/0075311 A1* | 3/2020 | Osaga | H01L 21/78 |
| 2022/0336232 A1* | 10/2022 | Sekiya | H01L 23/3107 |

FOREIGN PATENT DOCUMENTS

| | | | | |
|---|---|---|---|---|
| JP | 2008053341 | A | | 3/2008 |
| JP | 2010062375 | A | | 3/2010 |
| JP | 2019021883 | A | * | 2/2019 |
| TW | 200818366 | A | * | 4/2008 ............... B23K 1/08 |

OTHER PUBLICATIONS

Office Action issued in counterpart Japanese patent application No. 2021-092048, dated Mar. 5, 2025.

* cited by examiner

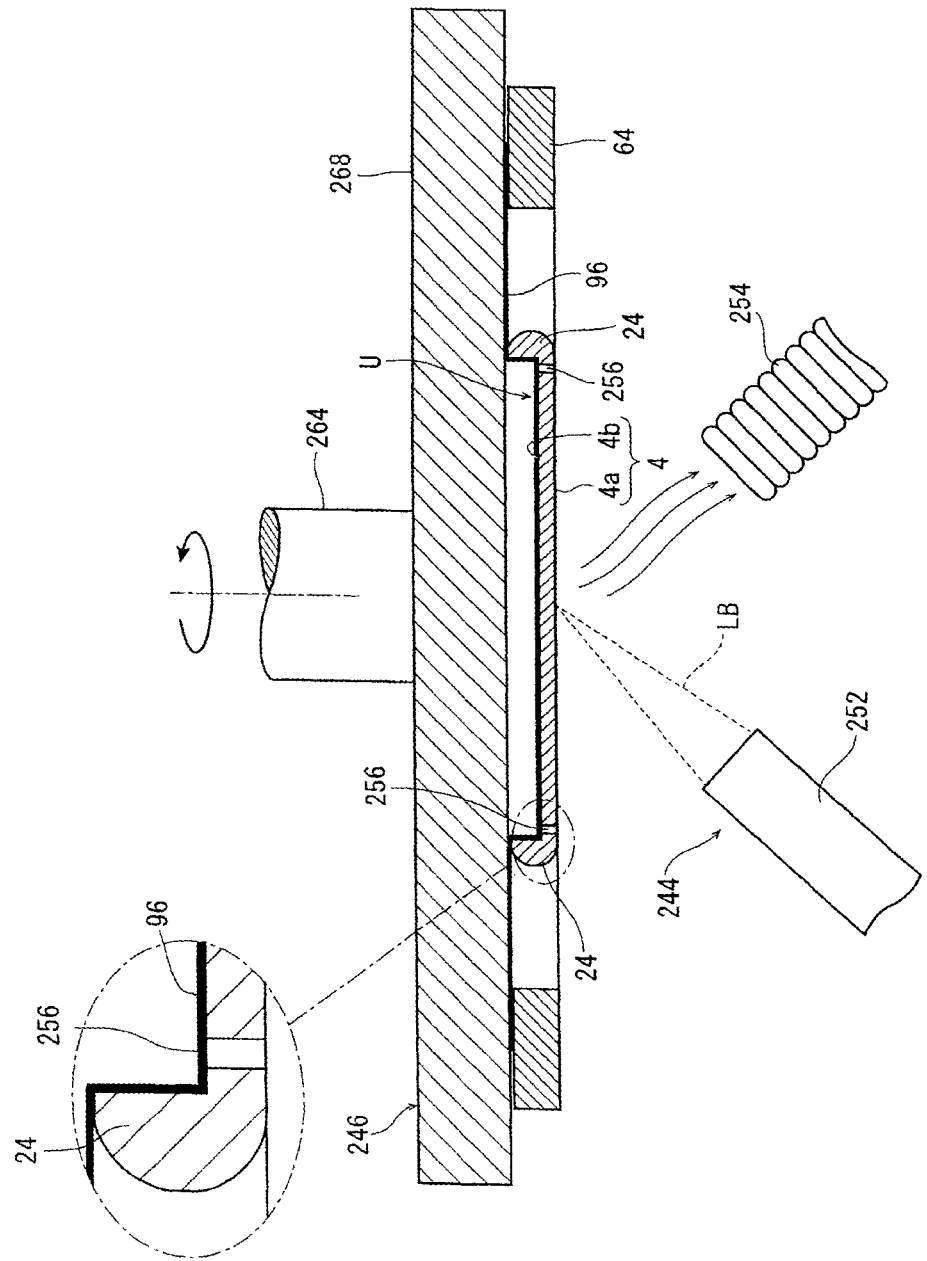

METHOD OF PROCESSING WAFER

BACKGROUND OF THE INVENTION

Field of the Invention

The present invention relates to a method of and an apparatus for processing a wafer to remove a protrusive ring-shaped stiffener from a reverse side of the wafer in an outer circumferential excess region thereof.

Description of the Related Art

Wafers have on their face side a device region where a plurality of devices such as integrated circuits (ICs) or large-scale integration (LSI) circuits are disposed in respective areas demarcated by a plurality of projected dicing lines and an outer circumferential excess region surrounding the device region. After such a wafer has its reverse side ground to thin itself down to a desired thickness, the wafer is divided into individual device chips by a dicing apparatus or a laser processing apparatus, and the device chips will be used in electronic appliances such as mobile phones and personal computers.

In order to facilitate the delivery of a ground wafer, there has been proposed a technology for leaving a ring-shaped stiffener on the reverse side of the wafer in its outer circumferential excess region, performing a predetermined process on the wafer, then affixing a dicing tape to the reverse side of the wafer, supporting the wafer on a frame, and removing the ring-shaped stiffener from the wafer (see, for example, Japanese Patent Laid-open No. 2010-62375).

SUMMARY OF THE INVENTION

However, since it is difficult to cut the wafer at certain positions to remove the ring-shaped stiffener appropriately from the wafer, the proposed technology is problematic in that it suffers poor productivity.

It is therefore an object of the present invention to provide a method of and an apparatus for processing a wafer to cut the wafer at certain positions to remove a ring-shaped stiffener appropriately from the wafer.

In accordance with an aspect of the present invention, there is provided a method of processing a wafer, including a frame preparing step of preparing a ring-shaped frame having an opening for accommodating a wafer therein, a wafer preparing step of preparing a wafer having a protrusive ring-shaped stiffener on a reverse side thereof in an outer circumferential excess region thereof, a frame unit producing step of producing a frame unit by affixing a tape to the frame and the reverse side of the wafer, a center setting step of capturing an image of the ring-shaped stiffener and setting a center of an inner circumferential circle of the ring-shaped stiffener on the basis of the captured image, a cutting step of rotating the frame unit around the center of the inner circumferential circle of the ring-shaped stiffener to cut the wafer along the inner circumferential circle of the ring-shaped stiffener, and a stiffener removing step of removing the ring-shaped stiffener severed from the frame unit.

Preferably, the method of processing a wafer further includes a step of capturing an image of a face side of the wafer that corresponds to the ring-shaped stiffener, inspecting whether there is a device or not in a region where the wafer is to be cut in order to remove the ring-shaped stiffener, and stopping processing the wafer if there is a device in the region. Further preferably, the center setting step includes a step of stopping processing the wafer if a region where the ring-shaped stiffener and the tape are not held in intimate contact with each other is detected.

In accordance with another aspect of the present invention, there is provided an apparatus for processing a wafer, including a wafer cassette table for supporting thereon a wafer cassette that stores a plurality of wafers therein, each of the wafers having a protrusive ring-shaped stiffener on a reverse side thereof in an outer circumferential excess region thereof, a wafer unloading mechanism for unloading one of the wafers from the wafer cassette placed on the wafer cassette table, a wafer table for supporting a face side of the wafer unloaded from the wafer cassette by the wafer unloading mechanism, a frame storage unit for storing a plurality of ring-shaped frames each having an opening for accommodating a wafer therein, a frame unloading mechanism for unloading one of the frames from the frame storage unit, a frame table for supporting thereon the frame unloaded from the frame storage unit by the frame unloading mechanism, a tape affixing unit disposed above the frame table for affixing a tape to the frame, a tape-affixed frame delivery mechanism for delivering the tape-affixed frame to the wafer table and placing the tape-affixed frame on the wafer table with the opening of the frame being positioned around the reverse side of the wafer supported on the wafer table, a tape pressure-bonding unit for pressure-bonding the tape of the tape-affixed frame to the reverse side of the wafer, a frame unit unloading mechanism for unloading a frame unit where the tape of the tape-affixed frame has been pressure-bonded to the reverse side of the wafer by the tape pressure-bonding unit from the wafer table, a stiffener removing unit for cutting and removing the ring-shaped stiffener from the wafer of the frame unit unloaded from the wafer table by the frame unit unloading mechanism, a stiffener-free frame unit unloading mechanism for unloading a stiffener-free frame unit that is free of the ring-shaped stiffener from the stiffener removing unit, and a frame cassette table for supporting thereon a frame cassette that stores therein the ring-free frame unit unloaded from the stiffener removing unit by the stiffener-free frame unit unloading mechanism. The frame unit unloading mechanism has a frame unit holder assembly including a wafer holder for holding a wafer and a frame holder for holding a holder, and a delivery mechanism for delivering the frame unit holder assembly to a temporary rest table. An upper camera is disposed between the wafer table and the temporary rest table for capturing an image of the reverse side of the wafer through the tape from above the frame unit. A center of an inner circumferential circle of the ring-shaped stiffener on the reverse side of the wafer is determined on the basis of the image captured by the upper camera.

Preferably, the frame unit unloading mechanism has a two-dimensional moving mechanism for moving the frame unit holder assembly two-dimensionally in a horizontal plane, and the two-dimensional moving mechanism is actuated to position the center of the inner circumferential circle of the ring-shaped stiffener in alignment with a center of the temporary rest table.

Preferably, a lower camera is disposed in facing relation to the upper camera with the frame unit interposed therebetween, the lower camera captures an image of the face side of the wafer that corresponds to the ring-shaped stiffener, it is inspected whether there is a device or not in a region where the wafer is to be cut in order to remove the ring-shaped stiffener, and the stiffener removing unit stops processing the wafer if there is a device in the region.

Preferably, the stiffener removing unit stops processing the wafer if a region where the ring-shaped stiffener and the tape are not held in intimate contact with each other is detected on the basis of the image captured by the upper camera.

Preferably, the tape pressure-bonding unit includes an upper chamber disposed above the wafer table, a lower chamber housing the wafer table therein, a lifting and lowering mechanism for selectively lowering the upper chamber into contact with the lower chamber to place the upper and lower chambers in a closed state and lifting the upper chamber out of contact with the lower chamber to place the upper and lower chambers in an open state, a vacuum source for evacuating the upper and lower chambers in the closed state, and a venting device for venting the upper and lower chambers to atmosphere. While the tape of the tape-affixed frame is positioned on the reverse side of the wafer supported on the wafer table, the lifting and lowering mechanism is actuated to keep the upper and lower chambers in the closed state and the vacuum source evacuates the upper and lower chambers, and a presser roller disposed in the upper chamber pressure-bonds the tape of the tape-affixed frame to the reverse side of the wafer.

Further preferably, the stiffener removing unit includes a laser beam applying unit for applying a laser beam to the wafer along the inner circumferential circle of the ring-shaped stiffener in the outer circumferential excess region of the wafer to form a cut groove in the wafer, a first lifting and lowering table for holding and lifting the frame unit temporarily placed on the temporary rest table and positioning the frame unit at the laser beam applying unit, and a separator for separating the ring-shaped stiffener from the wafer along the cut groove, and the separator includes an ultraviolet radiation applying unit for applying an ultraviolet radiation to the tape to reduce an adhesive power of the tape, a second lifting and lowering table for holding an inner area of the wafer under suction while exposing the ring-shaped stiffener radially outwardly, a separating unit for separating the ring-shaped stiffener by causing a wedge disk that has a wedge to act on an outer circumferential surface of the ring-shaped stiffener, and a disposer for disposing of the separated ring-shaped stiffener.

The method of processing a wafer according to the aspect of the present invention includes a frame preparing step of preparing a ring-shaped frame having an opening for accommodating a wafer therein, a wafer preparing step of preparing a wafer having a protrusive ring-shaped stiffener on a reverse side thereof in an outer circumferential excess region thereof, a frame unit producing step of producing a frame unit by affixing a tape to the frame and the reverse side of the wafer, a center setting step of capturing an image of the ring-shaped stiffener and setting a center of an inner circumferential circle of the ring-shaped stiffener on the basis of the captured image, a cutting step of rotating the frame unit around the center of the inner circumferential circle of the ring-shaped stiffener to cut the wafer along the inner circumferential circle of the ring-shaped stiffener, and a stiffener removing step of removing the ring-shaped stiffener severed from the frame unit. Consequently, the wafer can be cut along the inner circumferential circle of the ring-shaped stiffener, appropriately removing the ring-shaped stiffener from the wafer.

Moreover, the apparatus for processing a wafer according to the other aspect of the present invention includes the upper camera disposed between the wafer table and the temporary rest table for capturing an image of the reverse side of the wafer through the tape from above the frame unit, and the center of an inner circumferential circle of the ring-shaped stiffener on the reverse side of the wafer is determined on the basis of the image captured by the upper camera. Therefore, when the laser beam is applied to the wafer along the inner circumferential circle of the ring-shaped stiffener on the reverse side of the wafer, the wafer is cut along the inner circumferential circle of the ring-shaped stiffener, appropriately removing the ring-shaped stiffener from the wafer.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 14 is a cross-sectional view illustrating a manner in which a laser beam is applied to a base of a ring-shaped stiffener of a wafer in a cutting step;

DETAILED DESCRIPTION OF THE PREFERRED EMBODIMENT

A method of and an apparatus for processing a wafer according to a preferred embodiment of the present invention will be described hereinbelow in detail with reference to the accompanying drawings.

Figure 1:
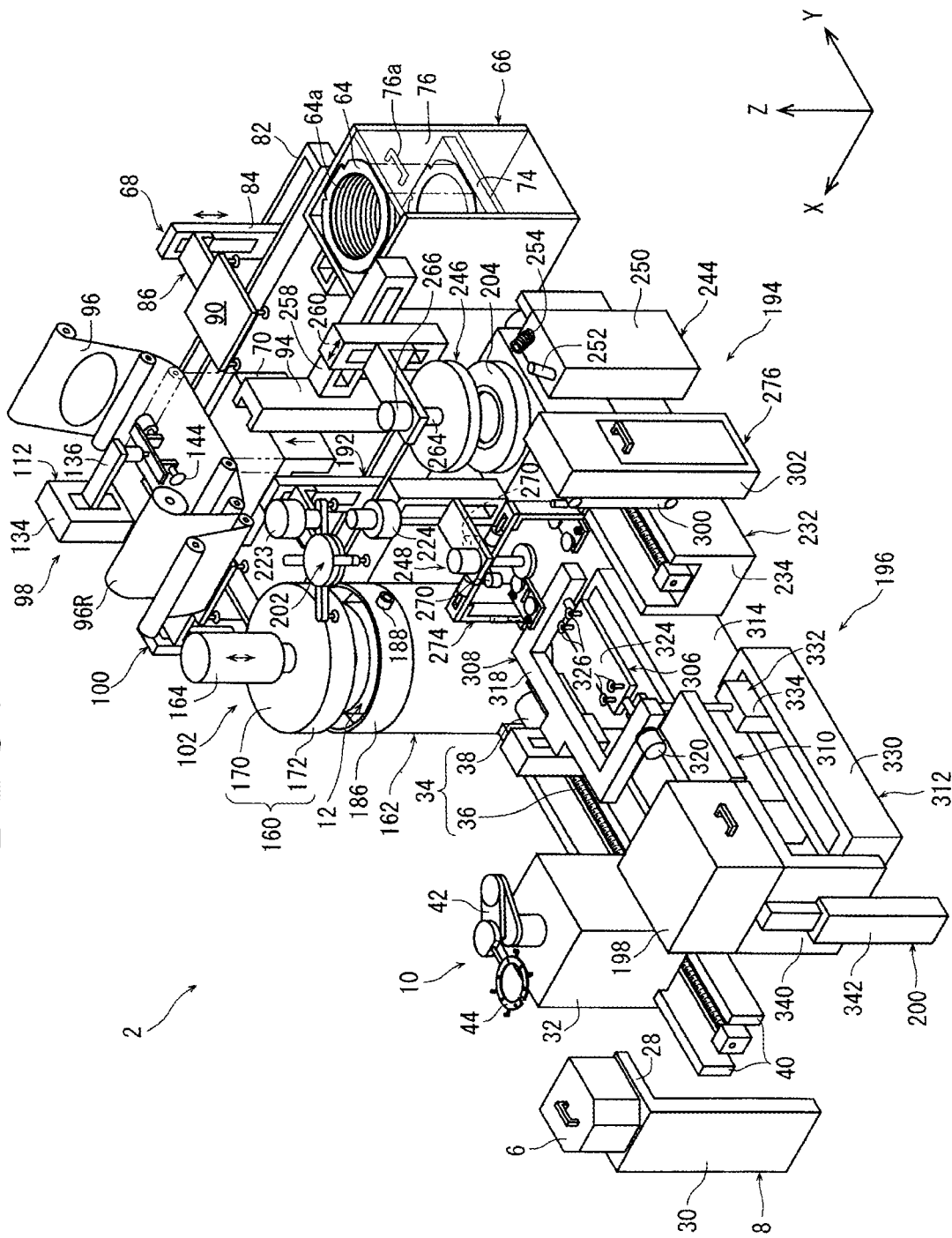
FIG. 1 is a perspective view of a wafer processing apparatus according to an embodiment of the present invention.

First, the apparatus for processing a wafer, hereinafter also referred to as a "wafer processing apparatus," will be described below. As illustrated in FIG. 1, the wafer processing apparatus, generally denoted by 2 in FIG. 1, includes a wafer cassette table 8 for supporting thereon a wafer cassette 6 that stores a plurality of wafers therein, a wafer unloading mechanism 10 for unloading a wafer from the wafer cassette 6 that is placed on the wafer cassette table 8, and a wafer table 12 for supporting a face side of the wafer unloaded from the wafer cassette 6 by the wafer unloading mechanism 10.

Figure 2:
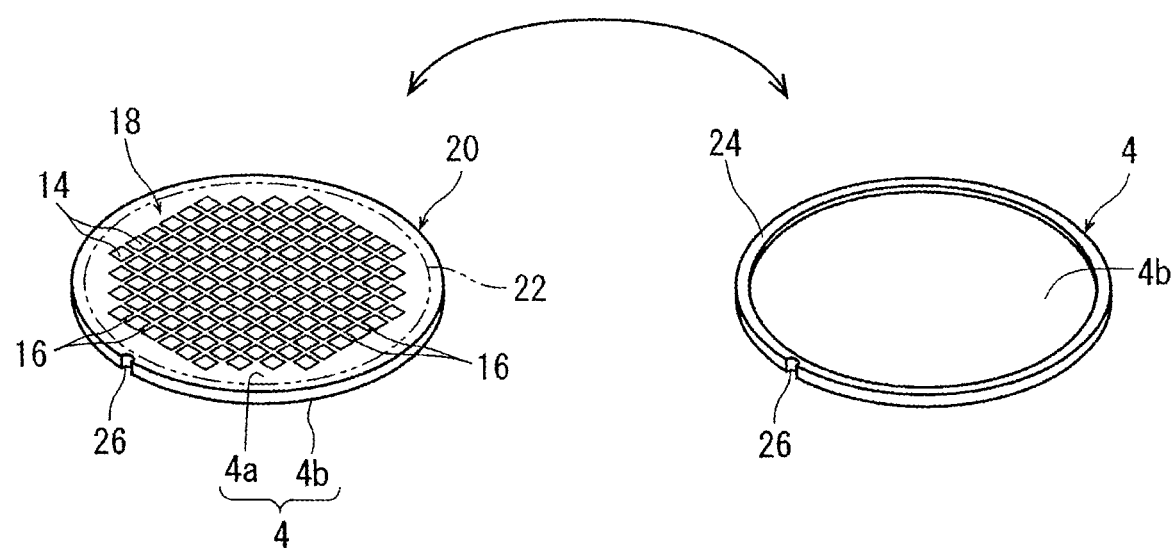
FIG. 2 is a perspective view of a wafer to be processed by the wafer processing apparatus illustrated in FIG. 1.

FIG. 2 illustrates in perspective a wafer 4 to be processed by the wafer processing apparatus 2. The wafer 4 has on a face side 4a thereof a device region 18 where a plurality of devices 14 such as ICs or LSI circuits are disposed in respective areas demarcated by a plurality of projected dicing lines 16 in a grid pattern and an outer circumferential excess region 20 surrounding the device region 18 that extends radially inwardly of the outer circumferential excess region 20. In FIG. 2, a boundary 22 between the device region 18 and the outer circumferential excess region 20 is represented by a two-dot-and-dash line. Actually, however, the wafer 4 is free of any line representing the boundary 22. The wafer 4 has on a reverse side 4b thereof a protrusive ring-shaped stiffener 24 in the outer circumferential excess region 20. The protrusive ring-shaped stiffener 24 makes the outer circumferential excess region 20 thicker than the device region 18. The wafer 4 also has a notch 26 defined in an outer circumferential edge portion thereof as representing a crystal orientation of the wafer 4.

Figure 3:
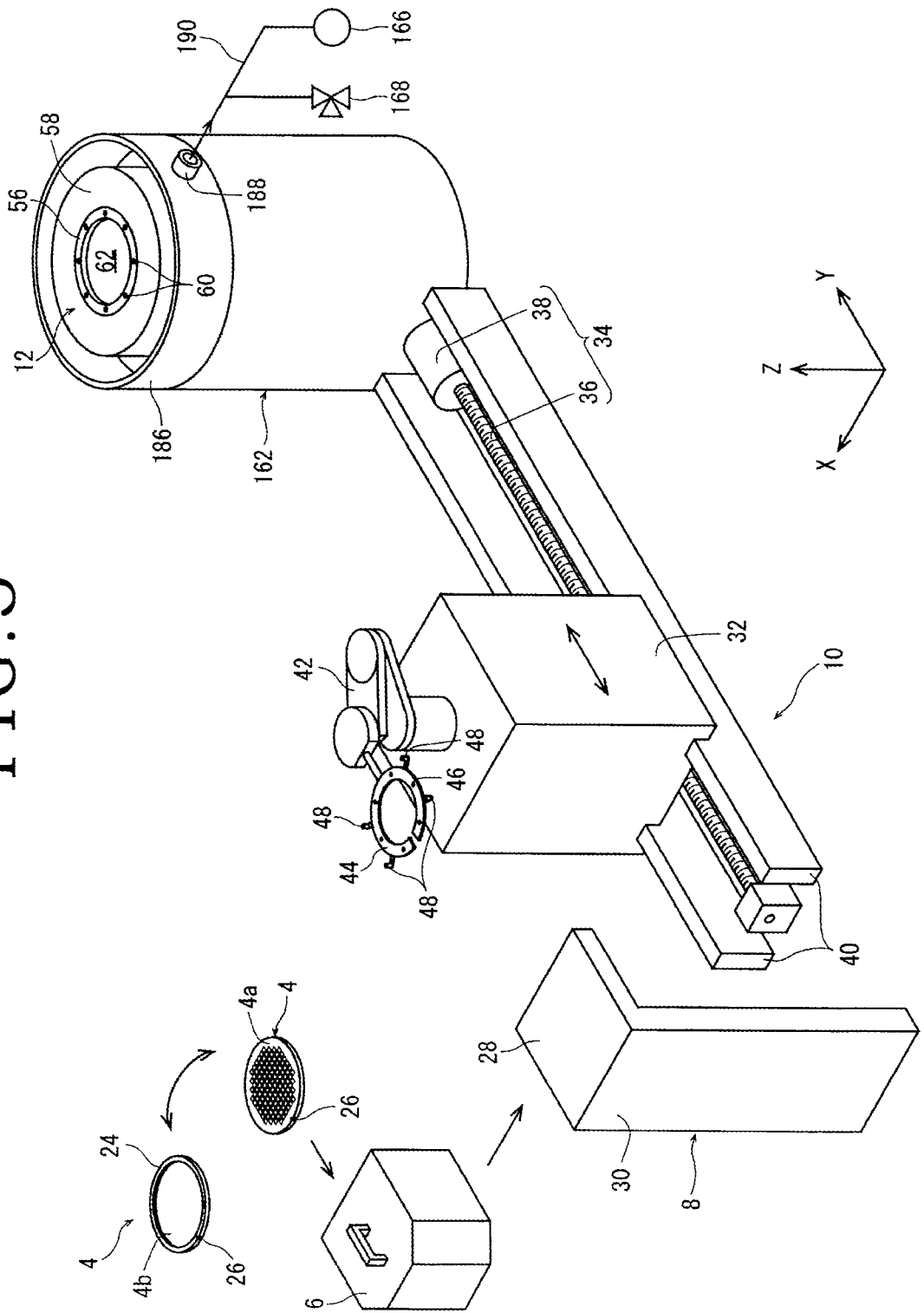
FIG. 3 is a perspective view of a wafer cassette table and other components of the wafer processing apparatus illustrated in FIG. 1.

As illustrated in FIG. 3, the wafer cassette 6 stores therein a plurality of wafers 4 at vertically spaced intervals with their face sides 4a facing upwardly. According to the illustrated embodiment, the wafer cassette table 8 has a top plate 28 for placing the wafer cassette 6 thereon and a support plate 30 that supports the top plate 28 on its upper end. The wafer cassette table 8 may incorporate a lifting and lowering mechanism, not illustrated, for lifting or lowering the top plate 28 to a desired height.

As illustrated in FIG. 3, the wafer unloading mechanism 10 includes a Y-axis movable member 32 movable along a Y-axis indicated by an arrow Y and a Y-axis feeding mechanism 34 for moving the Y-axis movable member 32 along the Y-axis. The Y-axis feeding mechanism 34 has a ball screw 36 operatively coupled to a lower end of the Y-axis movable member 32 and extending along the Y-axis and an electric motor 38 connected to one end of the ball screw 36 for rotating the ball screw 36 about its central axis. The Y-axis feeding mechanism 34 moves the Y-axis movable member 32 along a pair of guide rails 40 extending along the Y-axis by converting rotary motion of the electric motor 38 to linear motion with the ball screw 36 and transmitting the linear motion to the Y-axis movable member 32. In FIG. 3, an X-axis represented by an arrow X extends perpendicularly to the Y-axis, and a Z-axis represented by an arrow Z extends vertically perpendicularly to the X-axis and the Y-axis. The X-axis and the Y-axis jointly define an XY plane that lies essentially horizontally.

The wafer unloading mechanism 10 includes an articulated delivery arm 42 and a hand 44 disposed on a distal end of the delivery arm 42 for supporting the reverse side 4b of a wafer 4 in the wafer cassette 6 and inverting the wafer 4 upside down. The delivery arm 42 is mounted on an upper surface of the Y-axis movable member 32 and is actuatable by a suitable actuator such as a pneumatic actuator or an electric actuator, not illustrated. The actuator actuates the delivery arm 42 to position the hand 44 in a desired position along each of the X-axis, the Y-axis, and the Z-axis and to turn the hand 44 upside down.

Figure 4:
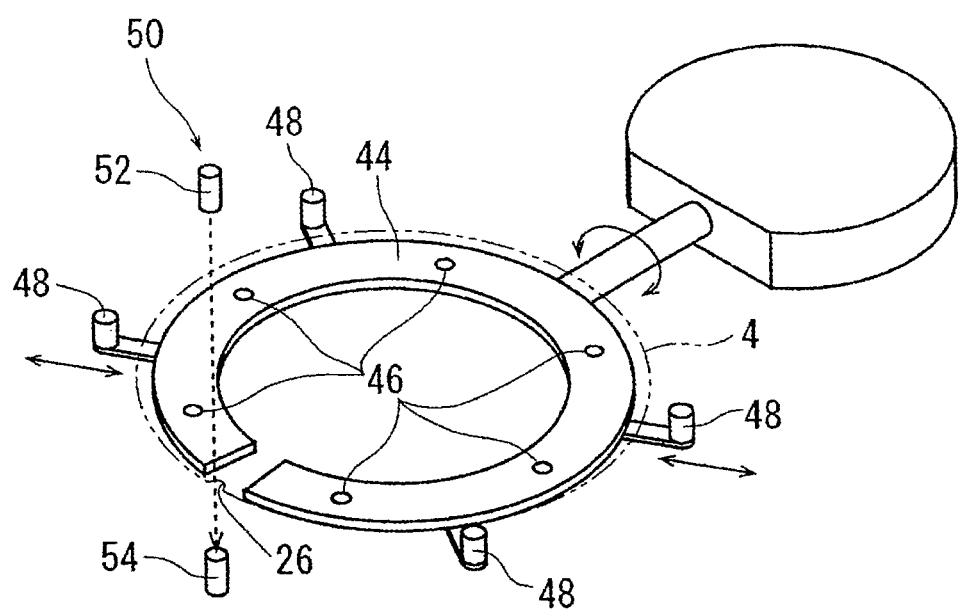
FIG. 4 is a perspective view of a hand of the wafer processing apparatus illustrated in FIG. 1.

As illustrated in FIG. 4, the hand 44 should preferably be a Bernoulli pad for supporting a wafer 4 out of contact therewith under a negative pressure generated by ejecting air therefrom. According to the illustrated embodiment, the hand 44 is C-shaped as a whole and has a plurality of air ejection ports 46 defined therein that are open at an upper surface thereof and connected to a compressed air supply source, not illustrated. A plurality of guide pins 48 are attached to an outer circumferential edge portion of the hand 44 at circumferentially spaced intervals. The guide pins 48 are individually movable radially of the hand 44.

The wafer unloading mechanism 10 operates as follows. As illustrated in FIGS. 3 and 4, after the hand 44 has been positioned beneath the reverse side 4b, i.e., the lower side, of a wafer 4 in the wafer cassette 6 placed on the wafer cassette table 8, compressed air supplied from the compressed air supply source is ejected from the air ejection ports 46 in the hand 44, developing a negative pressure on the upper surface of the hand 44 owing to the Bernoulli's principle. The hand 44 now holds the reverse side 4b of the wafer 4 under suction out of contact therewith. The guide pins 48 are then moved radially inwardly into contact with an outer circumferential edge of the wafer 4. The wafer 4 supported under suction over the hand 44 is limited against horizontal movement by the guide pins 48. The wafer unloading mechanism 10 then moves the Y-axis movable member 32 and the delivery arm 42 to unload the wafer 4 supported under suction over the hand 44 out of the wafer cassette 6.

As illustrated in FIG. 4, the wafer unloading mechanism 10 includes a notch detecting unit 50 for detecting the position of the notch 26 of the wafer 4. The notch detecting unit 50 may include, for example, a light emitter 52 and a light detector 54 that are vertically spaced from each other and a rotary actuator, not illustrated, for rotating at least one of the guide pins 48 of the hand 44.

The light emitter 52 and the light detector 54 may be attached to the Y-axis movable member 32 or a delivery passage therefor by a suitable bracket, not illustrated. When the at least one of the guide pins 48 is rotated by the rotary actuator, the wafer 4 supported under suction over the hand 44 is rotated about is central axis. In order to transmit the rotation of the guide pin 48 reliably to the wafer 4, it is preferable that the guide pin 48 have its outer circumferential surface made of suitable synthetic resin.

While the wafer 4 is being supported under suction over the hand 44 and the outer circumferential edge portion of the wafer 4 is being positioned between the light emitter 52 and the light detector 54, the notch detecting unit 50 can detect the position of the notch 26 by controlling the rotary actuator to rotate the guide pin 48 and hence the wafer 4 until the notch 26 is positioned in alignment with the light emitter 52 and the light detector 54. Accordingly, it is possible to adjust the orientation of the wafer 4 to a desired direction.

As illustrated in FIG. 3, the wafer table 12 is disposed adjacent to the wafer unloading mechanism 10. According to the illustrated embodiment, the wafer table 12 includes an annular support 56 for supporting the outer circumferential excess region 20 of a wafer 4 out of contact with the device region 18 that extends radially inwardly of the outer circumferential excess region 20, and a frame support 58 disposed around the annular support 56 for supporting a ring-shaped frame 64 (see FIG. 5) to be described later. The annular support 56 has a plurality of suction holes 60 defined therein at circumferentially spaced intervals and opening at an upper surface thereof. The suction holes 60 are connected to a suction source, not illustrated, such as a vacuum pump. The wafer table 12 has a circular cavity 62 defined therein radially inwardly of the annular support 56 and opening upwardly. The circular cavity 62 is recessed downwardly from the upper surface of the annular support 56.

The wafer unloading mechanism 10 then moves the wafer 4 held on the hand 44 along the Y-axis to the wafer table 12. At this time, the hand 44 with the wafer 4 held thereon is turned 180° upside down, inverting the wafer 4 upside down. Then, the hand 44 transfers the inverted wafer 4 with the face side 4a facing downwardly onto the wafer table 12, whereupon the outer circumferential excess region 20 of the wafer 4 is supported on the annular support 56 and the device region 18 of the wafer 4 is positioned over the cavity 62. Since the device region 18 where the devices 14 are formed lies over the cavity 62 and is kept out of contact with the wafer table 12, the devices 14 are prevented from being damaged by the wafer table 12. After the annular support 56 has supported the outer circumferential excess region 20 of the wafer 4, the suction source connected to the suction holes 60 is actuated to generate and transmit a suction force to the suction holes 60, so that the outer circumferential excess region 20 is held under suction on the annular support 56 to prevent the wafer 4 from being positionally shifted on the wafer table 12.

Figure 5:
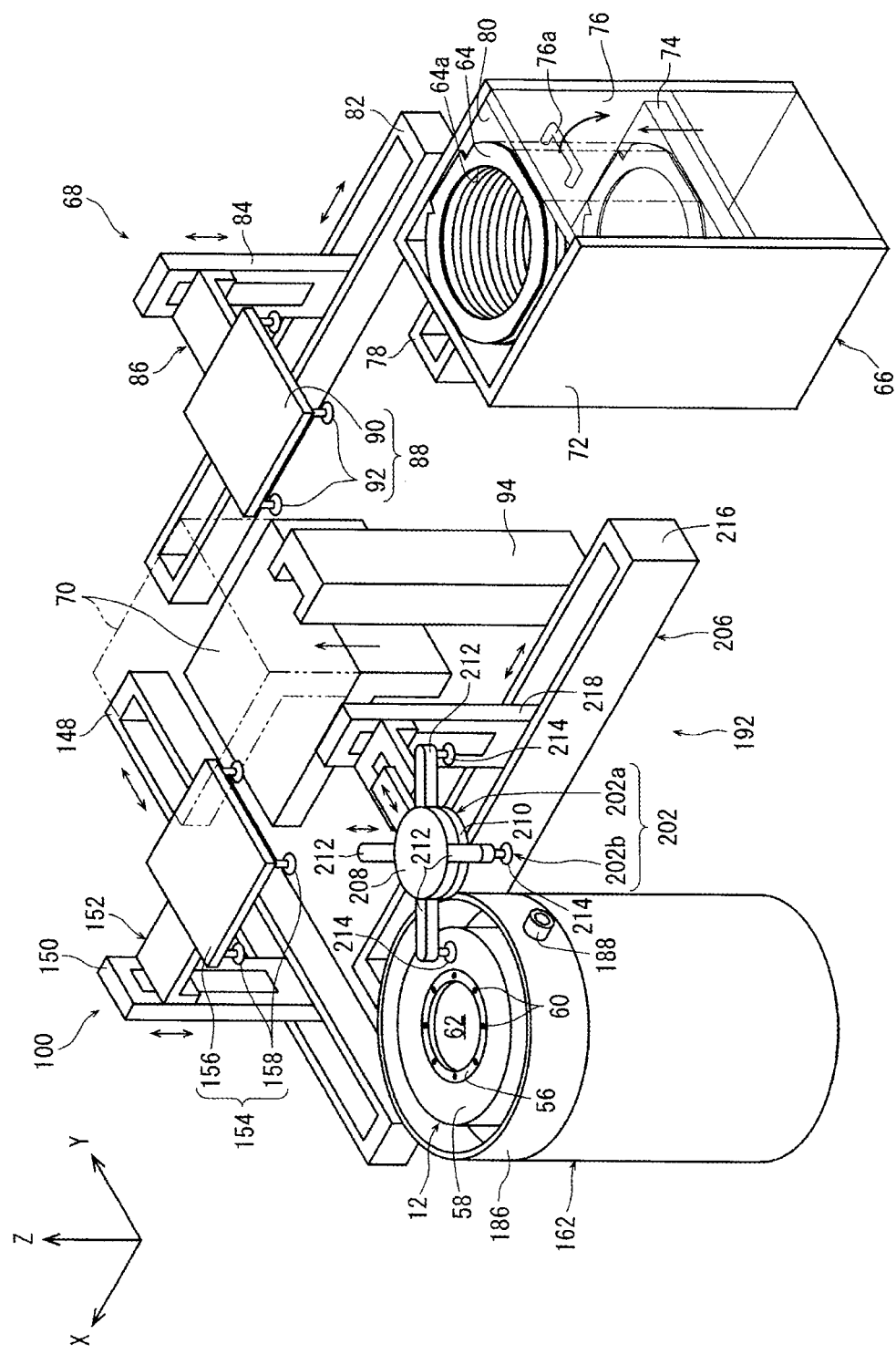
FIG. 5 is a perspective view of a frame storage unit and other components of the wafer processing apparatus illustrated in FIG. 1.

As illustrated in FIG. 5, the wafer processing apparatus 2 further includes a frame storage unit 66 for storing a stack of ring-shaped frames 64 each having an opening 64a for accommodating a wafer 4 therein, a frame unloading mechanism 68 for unloading a frame 64 from the frame storage unit 66, and a frame table 70 for supporting a frame 64 unloaded by the frame unloading mechanism 68.

According to the illustrated embodiment, as illustrated in FIG. 5, the frame storage unit 66 includes a housing 72, a lifting and lowering plate 74 vertically movably disposed in the housing 72, and a lifting and lowering mechanism, not illustrated, for selectively lifting and lowering the lifting and lowering plate 74 in the housing 72. A Z-axis guide member 78 that extends vertically along the Z-axis is disposed on a side surface of the housing 72 that faces away from the viewer of FIG. 5 along the X-axis. The lifting and lowering plate 74 is vertically movably supported by the Z-axis guide member 78. The lifting and lowering mechanism, not illustrated, for selectively lifting and lowering the lifting and lowering plate 74 is disposed in the Z-axis guide member 78. The lifting and lowering mechanism has, for example, a ball screw coupled to the lifting and lowering plate 74 and extending along the Z-axis and an electric motor for rotating the ball screw about its central axis.

The housing 72 has a hinged door 76 with a handle 76a attached to a side surface thereof that faces toward the viewer of FIG. 5 along the X-axis. When an operator of the wafer processing apparatus 2 grips and pulls the handle 76a to open the door 76, the operator can place frames 64 into the housing 72. The housing 72 has an opening 80 defined in an upper end thereof.

In the housing 72, the frames 64 are stacked on an upper surface of the lifting and lowering plate 74. An uppermost one of the stacked frames 64 is unloaded from the housing 72 through the opening 80 by the frame unloading mechanism 68. When the uppermost frame 64 has been unloaded from the housing 72 through the opening 80, the lifting and lowering mechanism, not illustrated, lifts the lifting and lowering plate 74 in the housing 72 to position a next uppermost one of the frames 64 thereon in a position where it can be unloaded from the housing 72 by the frame unloading mechanism 68.

As illustrated in FIG. 5, the frame unloading mechanism 68 includes an X-axis guide member 82 fixed to a suitable bracket, not illustrated, and extending along the X-axis, an X-axis movable member 84 movably supported on the X-axis guide member 82 for movement along the X-axis, an X-axis feeding mechanism, not illustrated, for moving the X-axis movable member 84 along the X-axis, a Z-axis movable member 86 movably supported on the X-axis movable member 84 for movement along the Z-axis, and a Z-axis feeding mechanism, not illustrated, for moving the Z-axis movable member 86 along the Z-axis. The X-axis feeding mechanism of the frame unloading mechanism 68 has, for example, a ball screw coupled to the X-axis movable member 84 and extending along the X-axis and an electric motor for rotating the ball screw about its central axis. The Z-axis feeding mechanism of the frame unloading mechanism 68 has, for example, a ball screw coupled to the Z-axis movable member 86 and extending along the Z-axis and an electric motor for rotating the ball screw about its central axis.

The Z-axis movable member 86 of the frame unloading mechanism 68 has a holder 88 for holding a frame 64 thereon. According to the illustrated embodiment, the holder 88 includes a rectangular base plate 90 and a plurality of suction pads 92 mounted on a lower surface of the base plate 90. The suction pads 92 are connected to a suction source, not illustrated.

The frame unloading mechanism 68 operates as follows. While the Z-axis movable member 86 is being positioned next to the frame storage unit 66, the suction pads 92 of the holder 88 hold the uppermost frame 64 in the frame storage unit 66 under suction, and then the X-axis movable member 84 and the Z-axis movable member 86 are moved to unload the uppermost frame 64 held by the suction pads 92 from the frame storage unit 66.

As illustrated in FIG. 5, the frame table 70 is vertically movably supported by a Z-axis guide member 94 for vertical movement between a lowered position indicated by solid lines and a lifted position indicated by two-dot-and-dash lines. The Z-axis guide member 94 is combined with an actuator such as a pneumatic actuator or an electric actuator, for example, for lifting and lowering the frame table 70 between the lowered position and the lifted position. The frame table 70 receives the frame 64 unloaded by the frame unloading mechanism 68 when the frame table 70 is in the lowered position.

As illustrated in FIGS. 1 and 5, the wafer processing apparatus 2 includes a tape affixing unit 98 (see FIG. 1) for affixing a tape 96 to a frame 64 on the frame table 70, a tape-affixed frame delivery mechanism 100 (see FIG. 5) for delivering a frame 64 with a tape 96 affixed thereto (hereinafter also referred to as a "tape-affixed frame 64'") to the wafer table 12 and placing a tape-affixed frame 64' on the wafer table 12 with the opening 64a of the frame 64 being positioned around the reverse side 4b of a wafer 4 supported on the wafer table 12, and a tape pressure-bonding unit 102 (see FIG. 1) for pressure-bonding the tape 96 of the tape-affixed frame 64' to the reverse side 4b of the wafer 4.

Figure 6A:
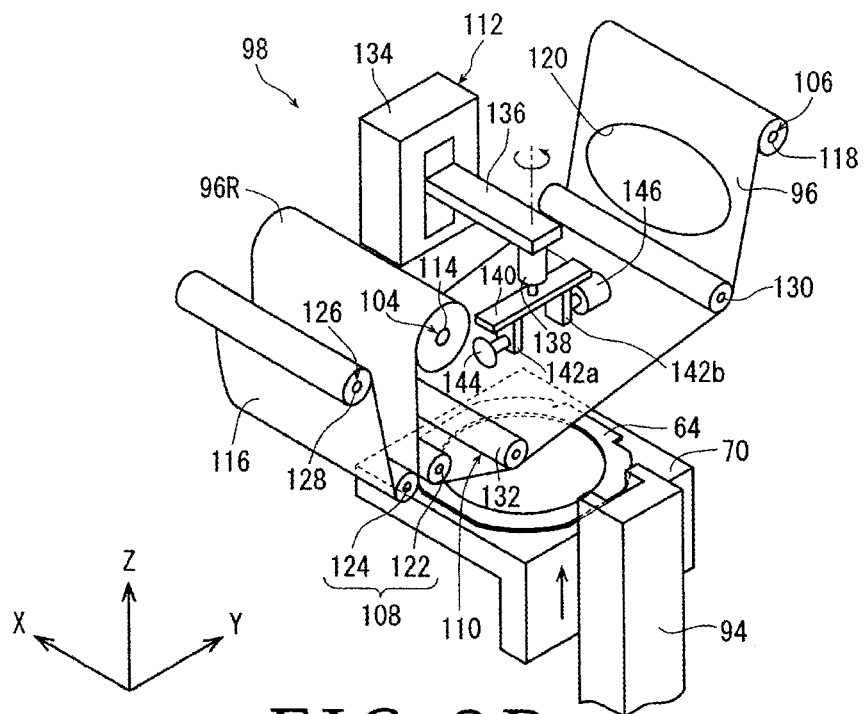
FIG. 6A is a perspective view of a tape affixing unit and other components of the wafer processing apparatus illustrated in FIG. 1 at the time a frame table thereof is disposed in a lowered position.
Figure 6B:
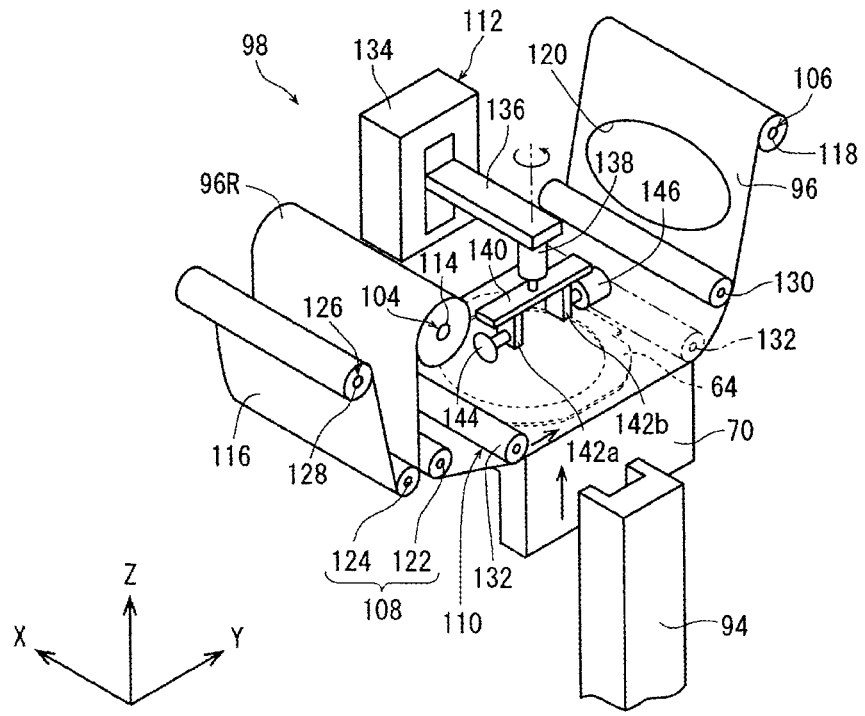
FIG. 6B is a perspective view of the tape affixing unit and other components of the wafer processing apparatus illustrated in FIG. 1 at the time the frame table thereof is disposed in a lifted position.

As illustrated in FIGS. 6A and 6B, the tape affixing unit 98 includes a tape roll support 104 for supporting a tape roll 96R that includes a wound tape 96 that has not been used, a tape take-up mechanism 106 for winding a used tape 96, a tape pay-out mechanism 108 for drawing the tape 96 from the tape roll 96R, a pressure-bonding mechanism 110 for pressure-bonding the drawn tape 96 to the frame 64 on the wafer table 12, and a cutting mechanism 112 for cutting off a portion of the tape 96 that protrudes radially outwardly from the outer circumferential edge of the frame 64 along the frame 64.

The tape roll support 104 includes a support roller 114 rotatably supported on a bracket, not illustrated, for rotation about its central axis that extends along the X-axis. The support roller 114 supports thereon the tape roll 96R where the tape 96 that includes an adhesive surface is wound into a hollow cylindrical shape with a peel-off sheet 116 of paper attached to the adhesive surface of the tape 96.

The tape take-up mechanism 106 includes a take-up roller 118 rotatably supported on a suitable bracket, not illustrated, for rotation about its central axis that extends along the X-axis and an electric motor, not illustrated, for rotating the take-up roller 118 about its central axis. When the electric motor is energized, it rotates the take-up roller 118 about its central axis, winding the used tape 96 where a circular opening 120 has been formed from the removal of a circular patch of the tape 96 that has been affixed to the frame 64.

The tape pay-out mechanism 108 includes a pay-out roller 122 disposed below the support roller 114 of the tape roll support 104, an electric motor, not illustrated, for rotating the pay-out roller 122 about its central axis, and a driven roller 124 rotatable by the pay-out roller 122 as it rotates. The tape 96 from the tape roll 96R is sandwiched between the pay-out roller 122 and the driven roller 124, so that the driven roller 124 is held against the pay-out roller 122 with the tape 96 interposed therebetween. The tape pay-out mechanism 108 pays out the tape 96 from the tape roll 96R when the electric motor rotates the pay-out roller 122 about its central axis, rotating the driven roller 124 about its central axis.

The peel-off sheet 116 of paper is peeled off from the tape 96 that has passed between the pay-out roller 122 and the driven roller 124, and wound by a peel-off sheet take-up mechanism 126. The peel-off sheet take-up mechanism 126 includes a peel-off sheet take-up roller 128 disposed above the driven roller 124 and an electric motor, not illustrated, for rotating the peel-off sheet take-up roller 128 about its central axis. The tape 96 from which the peel-off sheet 116 of paper has been peeled off travels around a guide roller 130, which is spaced from the pay-out roller 122 along the Y-axis, toward the take-up roller 118.

The pressure-bonding mechanism 110 includes a presser roller 132 extending perpendicularly to the Y-axis and rollingly movable along the Y-axis and a Y-axis feeding mechanism, not illustrated, for rollingly moving the presser roller 132 along the Y-axis. The Y-axis feeding mechanism may include an actuator such as a pneumatic actuator or an electric actuator, for example.

The cutting mechanism 112 includes a Z-axis guide member 134 fixed to a suitable bracket, not illustrated, and extending along the Z-axis, a Z-axis movable member 136 movably supported by the Z-axis guide member 134 for movement along the Z-axis, and a Z-axis feeding mechanism, not illustrated, for moving the Z-axis movable member 136 along the Z-axis. The Z-axis feeding mechanism has, for example, a ball screw operatively coupled to the Z-axis movable member 136 and extending along the Z-axis and an electric motor for rotating the ball screw about its central axis.

The cutting mechanism 112 also includes an electric motor 138 fixed to a lower surface of a distal end of the Z-axis movable member 136 and an arm 140 coupled to the output shaft of the electric motor 138 and rotatable by the electric motor 138 about its central axis extending along the Z-axis. The arm 140 has a lower surface on which there are mounted first and second hanging legs 142a and 142b that are spaced from each other. The first hanging leg 142a supports thereon a circular cutter 144 rotatable about its central axis perpendicular to the Z-axis. The second hanging leg 142b supports thereon a presser roller 146 rotatable about its central axis perpendicular to the Z-axis. The cutter 144 is positioned in vertical alignment with a position immediately outside of the outer circumferential edge of a frame 64 on the frame table 70, and the presser roller 146 is positioned in vertical alignment with the frame 64 on the frame table 70.

The tape affixing unit 98 operates as follows. Before the frame table 70 that has received a frame 64 from the frame unloading mechanism 68 is moved from the lowered position illustrated in FIG. 6A to the lifted position illustrated in FIG. 6B, the pay-out roller 122 and the driven roller 124 draw the unused tape 96 from the tape roll 96R. Then, the frame table 70 is positioned in the lifted position where the presser roller 132 of the pressure-bonding mechanism 110 can press the tape 96 against the frame 64, bringing the frame 64 into contact with the presser roller 132 with the tape 96 interposed therebetween. Then, the presser roller 132 is rollingly moved along the Y-axis while pressing the adhesive surface of the tape 96 against the frame 64. The pressure-bonding mechanism 110 thus pressure-bonds the tape 96 drawn from the tape roll 96R by the tape pay-out mechanism 108 to the frame 64 on the frame table 70.

After the tape 96 has been pressure-bonded to the frame 64, the Z-axis feeding mechanism of the cutting mechanism 112 lowers the Z-axis movable member 136 of the cutting mechanism 112 to hold the cutter 144 against the tape 96 on the frame 64 and also hold the presser roller 146 against the frame 64 with the tape 96 interposed therebetween. Then, the electric motor 138 is energized to rotate the arm 140 about its central axis along the Z-axis, causing the cutter 144 and the presser roller 146 to move in a circle along the frame 64. Therefore, the cutter 144 cuts off a portion of the tape 96 that protrudes radially outwardly from the outer circumferential edge of the frame 64 along the frame 64. Since the presser roller 146 is held against the frame 64 with the tape 96 interposed therebetween, the frame 64 and the tape 96 are prevented from being shifted in position while the cutter 144 is cutting the tape 96. Then, the frame table 70 is lowered, and thereafter, the used tape 96 where a circular patch of the tape 96 has been cut off from the tape 96 by the cutter 144, leaving a circular opening 120 in the tape 96, is wound up by the tape take-up mechanism 106.

As illustrated in FIG. 5, the tape-affixed frame delivery mechanism 100 includes a Y-axis guide member 148 fixed to a suitable bracket, not illustrated, and extending along the Y-axis, a Y-axis movable member 150 movably supported on the Y-axis guide member 148 for movement along the Y-axis, a Y-axis feeding mechanism, not illustrated, for moving the Y-axis movable member 150 along the Y-axis, a Z-axis movable member 152 movably supported on the Y-axis movable member 150 for movement along the Z-axis, and a Z-axis feeding mechanism, not illustrated, for moving the Z-axis movable member 152 along the Z-axis. The Y-axis feeding mechanism of the tape-affixed frame delivery mechanism 100 has, for example, a ball screw coupled to the Y-axis movable member 150 and extending along the Y-axis and an electric motor for rotating the ball screw about its central axis. The Z-axis feeding mechanism of the tape-affixed frame delivery mechanism 100 has, for example, a ball screw coupled to the Z-axis movable member 152 and extending along the Z-axis and an electric motor for rotating the ball screw about its central axis.

The Z-axis movable member 152 of the tape-affixed frame delivery mechanism 100 has a holder 154 for holding a tape-affixed frame 64' thereon. According to the illustrated embodiment, the holder 154 includes a rectangular base plate 156 and a plurality of suction pads 158 mounted on a lower surface of the base plate 156. The suction pads 158 are connected to a suction source, not illustrated.

The tape-affixed frame delivery mechanism 100 operates as follows. While the Z-axis movable member 152 is being positioned next to the frame table 70, the suction pads 158 of the holder 154 hold under suction the upper surface of a tape-affixed frame 64' supported on the frame table 70 with the adhesive surface of the tape 96 facing downwardly, and then the Y-axis movable member 150 and the Z-axis movable member 152 are moved to deliver the tape-affixed frame 64' held under suction by the suction pads 158 from the frame table 70 to the wafer table 12 and place the tape-affixed frame 64' onto the wafer table 12 with the opening 64a of the frame 64 being positioned around the reverse side 4b of a wafer 4 supported on the wafer table 12.

Figure 7:
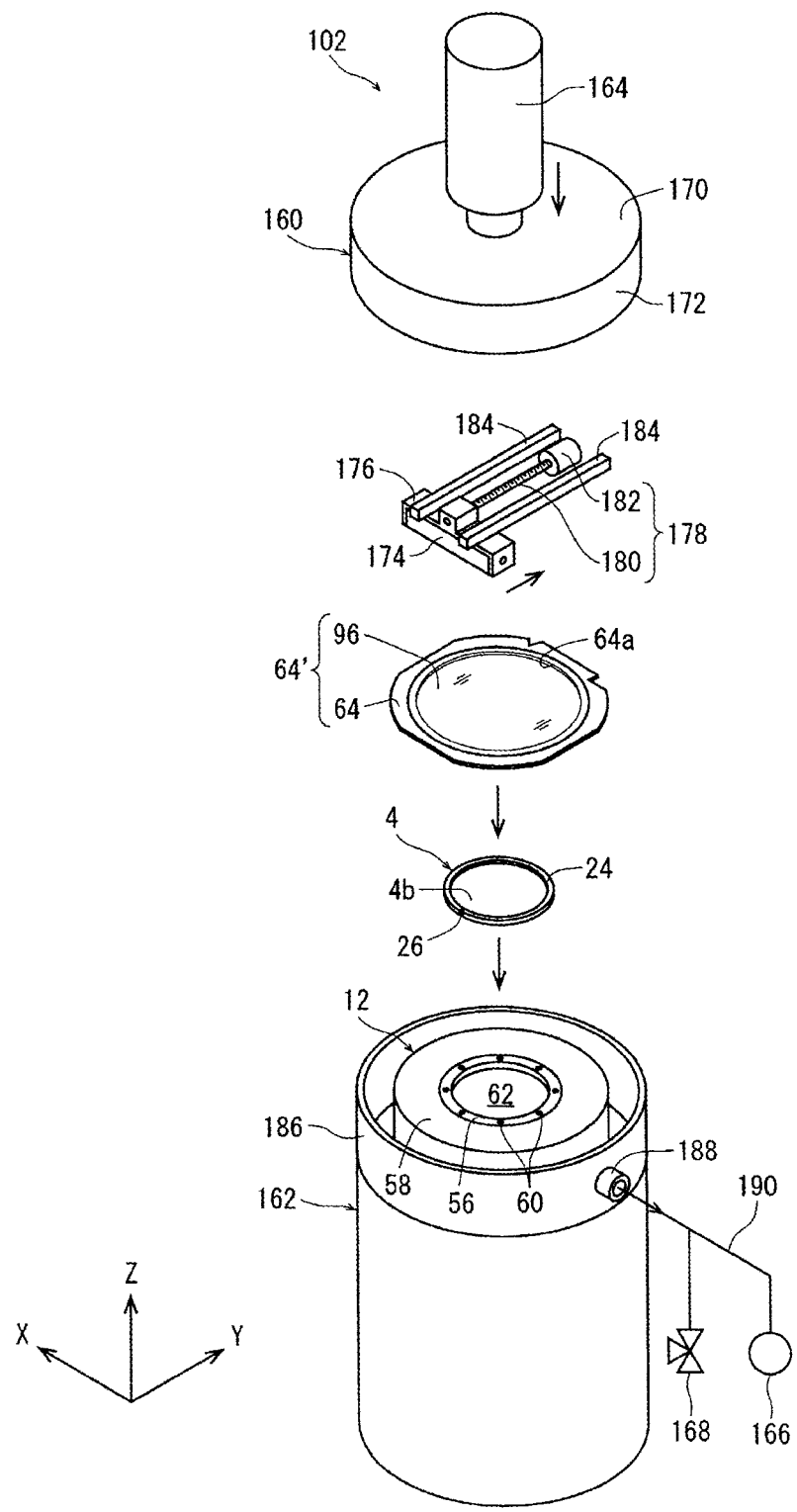
FIG. 7 is an exploded perspective view of a tape pressure-bonding unit of the wafer processing apparatus illustrated in FIG. 1.

The tape pressure-bonding unit 102 will be described below with reference to FIGS. 7 through 9. As illustrated in FIG. 7, the tape pressure-bonding unit 102 includes an upper chamber 160 disposed above the wafer table 12, a lower chamber 162 housing the wafer table 12 therein, a lifting and lowering mechanism 164 for selectively lowering the upper chamber 160 into contact with the lower chamber 162 to place the upper and lower chambers 160 and 162 in a closed state and lifting the upper chamber 160 out of contact with the lower chamber 162 to place the upper and lower chambers 160 and 162 in an open state, a vacuum source 166 for evacuating the upper and lower chambers 160 and 162 in the closed state, and a venting device 168 for venting the upper and lower chambers 160 and 162 to the atmosphere.

According to the illustrated embodiment, as illustrated in FIG. 7, the upper chamber 160 includes a circular upper plate 170 and a hollow cylindrical side wall 172 hanging from a circumferential edge of the upper plate 170. The lifting and lowering mechanism 164 includes a suitable actuator such as an air cylinder mounted on an upper surface of the upper plate 170. The upper chamber 160 has a storage space defined therein by a lower surface of the upper plate 170 and an inner circumferential surface of the side wall 172. The storage space houses therein a presser roller 174 for pressing the tape 96 of a tape-affixed frame 64' against the reverse side 4b of a wafer 4 supported on the wafer table 12, a support bar 176 on which the presser roller 174 is rotatably supported, and a Y-axis feeding mechanism 178 for moving the support bar 176 along the Y-axis.

The Y-axis feeding mechanism 178 includes a ball screw 180 having an end coupled to the support bar 176 and extending along the Y-axis and an electric motor 182 for rotating the ball screw 180 about its central axis. The Y-axis feeding mechanism 178 moves the support bar 176 along a pair of guide rails 184 extending along the Y-axis by converting rotary motion of the electric motor 182 to linear motion with the ball screw 180 and transmitting the linear motion to the support bar 176.

As illustrated in FIG. 7, the lower chamber 162 has a hollow cylindrical side wall 186 that is open upwardly at an upper end thereof and has a closed lower end. The side wall 186 has a joint open port 188 connected to the vacuum source 166, which may include a suitable vacuum pump, through a fluid passageway 190. The venting device 168, which may include a suitable valve, is connected to the fluid passageway 190 for venting the fluid passageway 190 to the atmosphere.

The tape pressure-bonding unit 102 operates as follows. While the tape 96 of a tape-affixed frame 64' is being positioned on the reverse side 4b of a wafer 4 supported on the wafer table 12, the lifting and lowering mechanism 164 lowers the upper chamber 160 until a lower end of the side wall 172 of the upper chamber 160 is brought into contact with an upper end of the side wall 186 of the lower chamber 162, whereupon the upper and lower chambers 160 and 162 are put into the closed state and the presser roller 174 is brought into contact with the tape-affixed frame 64'.

Then, the vacuum pump of the vacuum source 166 is actuated while the valve of the venting device 168 is being closed, evacuating the upper and lower chambers 160 and 162. Thereafter, as illustrated in FIGS. 8 and 9, the Y-axis feeding mechanism 178 rollingly moves the presser roller 174 along the Y-axis as indicated by an arrow in FIG. 8, pressure-bonding the tape 96 to the reverse side 4b of the wafer 4 to produce a frame unit U (see FIG. 9). FIG. 10A illustrates the frame unit U in perspective with the face side 4a of the wafer 4 being visible, and FIG. 10B illustrates the frame unit U in perspective with the reverse side 4b of the wafer 4 being visible.

When the tape 96 is pressure-bonded to the reverse side 4b of the wafer 4 by the presser roller 174, a small gap is created between the wafer 4 and the tape 96 at the base of the ring-shaped stiffener 24. Since the wafer 4 and the tape 96 are pressure-bonded to each other while the upper and lower chambers 160 and 162 are being evacuated, the pressure in the small gap between the wafer 4 and the tape 96 is lower than the atmospheric pressure. When the venting device 168 vents the upper and lower chambers 160 and 162 to the atmosphere after the tape 96 has been pressure-bonded to the wafer 4, the tape 96 is pressed against the wafer 4 under the atmospheric pressure. The gap between the wafer 4 and the tape 96 at the base of the ring-shaped stiffener 24 is thus eliminated, so that the tape 96 is held in intimate contact with the reverse side 4b of the wafer 4 all the way along the base of the ring-shaped stiffener 24.

Figure 11:
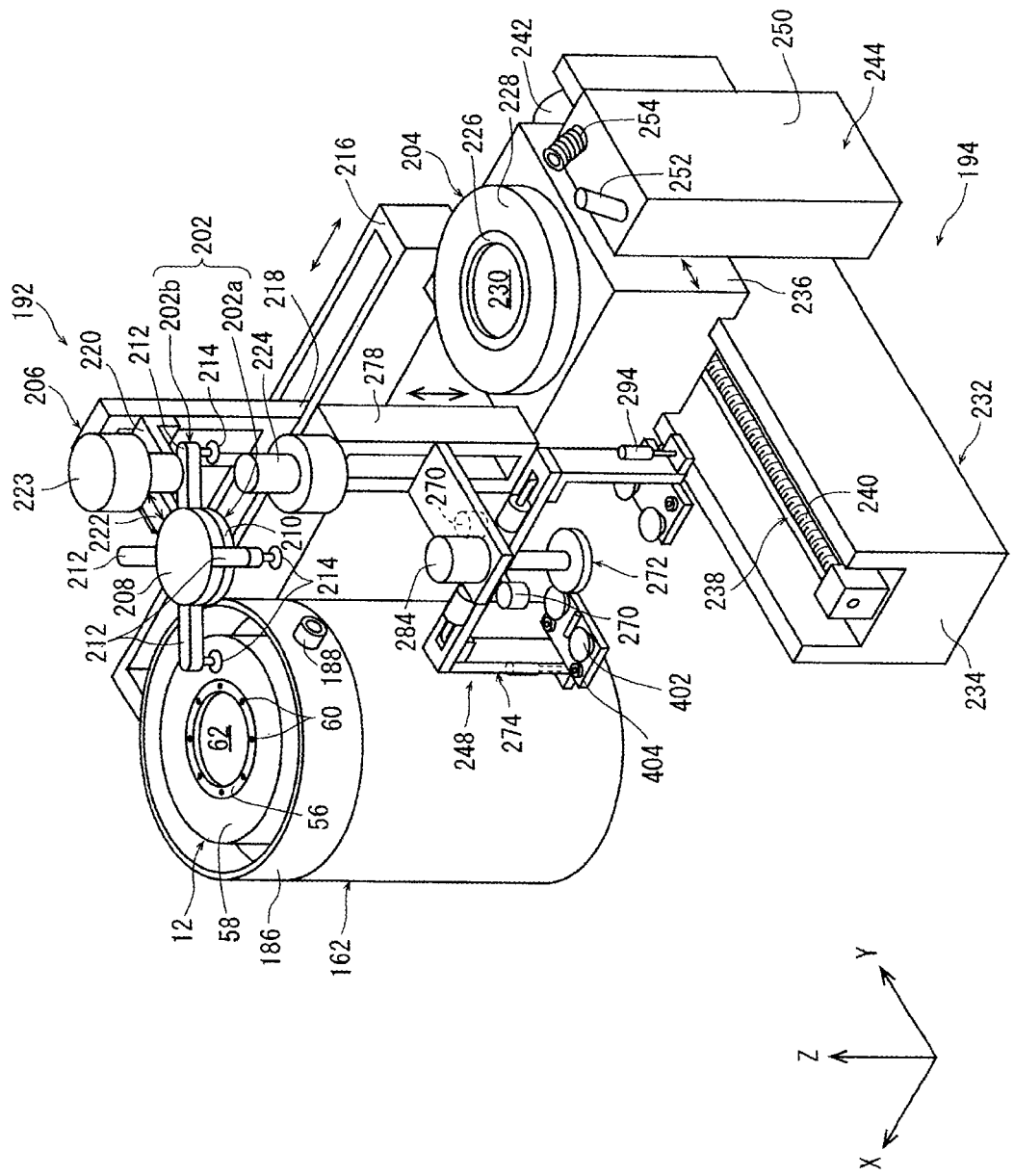
FIG. 11 is a perspective view of a stiffener removing unit of the wafer processing apparatus illustrated in FIG. 1.

As illustrated in FIGS. 1 and 11, the wafer processing apparatus 2 further includes a frame unit unloading mechanism 192 for unloading a frame unit U where the tape 96 of a tape-affixed frame 64' and the reverse side 4b of a wafer 4 have been pressure-bonded to each other by the tape pressure-bonding unit 102 from the wafer table 12, a stiffener removing unit 194 for cutting off and removing the ring-shaped stiffener 24 from the wafer 4 of the frame unit U unloaded by the frame unit unloading mechanism 192, a stiffener-free frame unit unloading mechanism 196 (see FIG. 1) for unloading a stiffener-free frame unit that is free of the ring-shaped stiffener 24 from the stiffener removing unit 194, and a frame cassette table 200 (see FIG. 1) for supporting thereon a frame cassette 198 that stores therein the stiffener-free frame unit unloaded from the stiffener removing unit 194 by the stiffener-free frame unit unloading mechanism 196.

As illustrated in FIG. 11, the frame unit unloading mechanism 192 includes a frame unit holder assembly 202 having a wafer holder 202a for holding a wafer 4 and a frame holder 202b for holding a frame 64, and a delivery mechanism 206 for delivering the frame unit holder assembly 202 to a temporary rest table 204.

The wafer holder 202a of the frame unit holder assembly 202 includes a circular base plate 208 and a circular suction member 210 mounted on a lower surface of the base plate 208. The suction member 210 has a plurality of suction holes, not illustrated, defined therein that are open at a lower surface thereof and are connected to a suction source, not illustrated. The frame holder 202b includes a plurality of, e.g., four in the illustrated embodiment, protrusive arms 212 spaced circumferentially around and protruding radially outwardly from an outer circumferential edge of the base plate 208 and a plurality of corresponding suction pads 214 disposed on respective lower surfaces of the protrusive arms 212. The suction pads 214 are connected to the suction source connected to the suction member 210.

The delivery mechanism 206 includes an X-axis guide member 216 fixed to a suitable bracket, not illustrated, and extending along the X-axis, an X-axis movable member 218 movably supported on the X-axis guide member 216 for movement along the X-axis, an X-axis feeding mechanism, not illustrated, for moving the X-axis movable member 218 along the X-axis, a Z-axis movable member 220 movably supported on the X-axis movable member 218 for movement along the Z-axis, a Z-axis feeding mechanism, not illustrated, for moving the Z-axis movable member 220 along the Z-axis, a Y-axis movable member 222 movably supported on the Z-axis movable member 220 for movement along the Y-axis, and a Y-axis feeding mechanism, not illustrated, for moving the Y-axis movable member 222 along the Y-axis. The base plate 208 of the wafer holder 202a is coupled to a distal end of the Y-axis movable member 222. Each of the X-axis, Y-axis, and Z-axis feeding mechanisms of the delivery mechanism 206 has a ball screw and an electric motor for rotating the ball screw about its central axis, for example.

The frame unit unloading mechanism 192 should preferably include a two-dimensional moving mechanism for moving the frame unit holder assembly 202 two-dimensionally in a horizontal plane. According to the illustrated embodiment, as the X-axis and Y-axis feeding mechanisms of the delivery mechanism 206 move the frame unit holder assembly 202 two-dimensionally in a horizontal plane, the delivery mechanism 206 provides such a two-dimensional moving mechanism.

Figure 12:
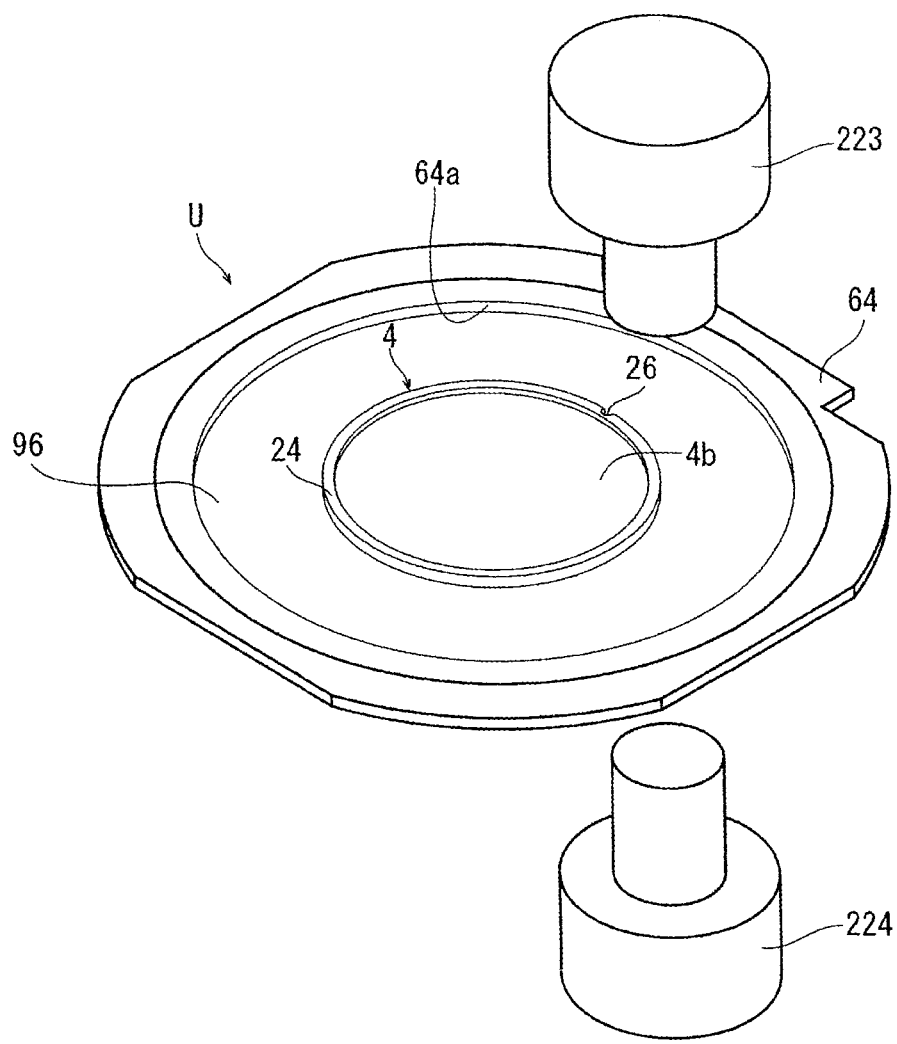
FIG. 12 is a perspective view illustrating a manner in which the frame unit is positioned between an upper camera and a lower camera of a frame unit unloading mechanism of the wafer processing apparatus illustrated in FIG. 1.

As illustrated in FIGS. 11 and 12, the frame unit unloading mechanism 192 includes an upper camera 223 disposed in a region between the wafer table 12 and the temporary rest table 204, for capturing an image of the reverse side 4b of a wafer 4 through the tape 96 from above the frame unit U and a lower camera 224 disposed in facing relation to the upper camera 223 with the frame unit U interposed therebetween, for capturing an image of a portion of the face side 4a of the wafer 4 that corresponds to the ring-shaped stiffener 24. The lower camera 224 is positioned directly below the upper camera 223.

The frame unit unloading mechanism 192 operates as follows. While the suction member 210 of the wafer holder 202a is holding the wafer 4 on its reverse side 4b, i.e., the tape 96, under suction and the suction pads 214 of the frame holder 202b are holding the frame 64 under suction, the delivery mechanism 206 is actuated to unload the frame unit U held by the frame unit holder assembly 202 from the wafer table 12.

The delivery mechanism 206 is actuated, and the upper camera 223 captures an image of the reverse side 4b of the wafer 4 through the tape 96 from above the frame unit U. Specifically, the upper camera 223 captures an image of at least three portions of an inner circumferential circle of the ring-shaped stiffener 24. It is thus possible to measure coordinates of the at least three portions of the inner circumferential circle of the ring-shaped stiffener 24 on the basis of the captured images and to determine coordinates of the center of the inner circumferential circle of the ring-shaped stiffener 24 on the basis of the measured coordinates of the at least three portions of the inner circumferential circle of the ring-shaped stiffener 24.

The delivery mechanism 206 is actuated, and the lower camera 224 captures an image of the portion of the face side 4a of the wafer 4 that corresponds to the ring-shaped stiffener 24 from below the frame unit U. It is thus possible to inspect whether there is a device 14 or not in a region where the wafer 4 is to be cut in order to remove the ring-shaped stiffener 24, i.e., in the inner circumferential circle of the ring-shaped stiffener 24.

Figure 13A:
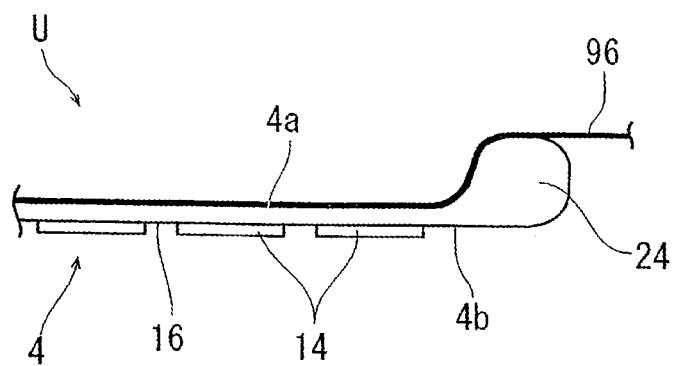
FIG. 13A is a fragmentary cross-sectional view of a frame unit where no device is present on a ring-shaped stiffener and a tape is held in intimate contact with the ring-shaped stiffener.

If there is no device 14 in the region where the wafer 4 is to be cut in order to remove the ring-shaped stiffener 24 as illustrated in FIG. 13A, then the delivery mechanism 206 is actuated to place the frame unit U temporarily on the temporary rest table 24 such that the center of the inner circumferential circle of the ring-shaped stiffener 24 is aligned with the center of the temporary rest table 204.

On the other hand, if there is a device 14 in the region where the wafer 4 is to be cut in order to remove the ring-shaped stiffener 24, then the wafer processing apparatus 2 stops processing the frame unit U. For example, if a device 14 overlaps the ring-shaped stiffener 24 as illustrated in FIG.

13B, then a grinding apparatus, not illustrated, is used to grind the ring-shaped stiffener 24 to reduce the width of the ring-shaped stiffener 24 in order to keep the device 14 from overlapping the ring-shaped stiffener 24. When the wafer 4 is subsequently cut to remove the ring-shaped stiffener 24, the device 14 is prevented from being severed.

Figure 13B:
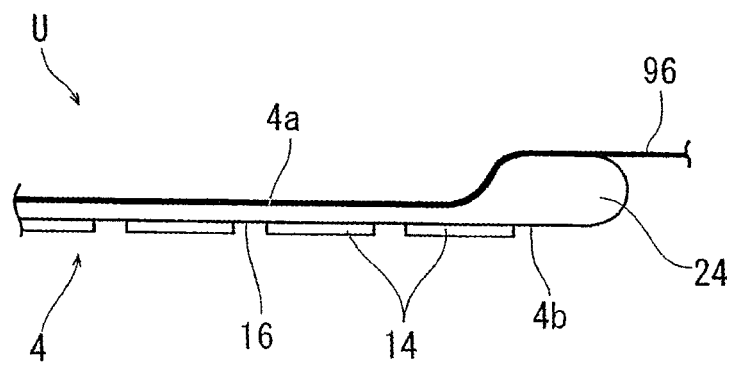
FIG. 13B is a fragmentary cross-sectional view of a frame unit where a device overlaps a ring-shaped stiffener and a tape is held in intimate contact with the ring-shaped stiffener.
Figure 13C:
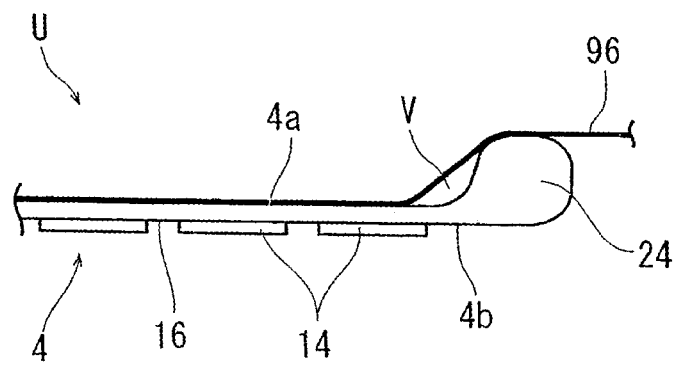
FIG. 13C is a fragmentary cross-sectional view of a frame unit where no device is present on a ring-shaped stiffener and a tape is not held in intimate contact with the ring-shaped stiffener.

Moreover, the wafer processing apparatus 2 also stops processing the frame unit U if it has detected a region where the ring-shaped stiffener 24 and the tape 96 are not held in intimate contact with each other on the basis of an image captured by the upper camera 223 along the ring-shaped stiffener 24. For example, if there is a clearance V between the ring-shaped stiffener 24 and the tape 96 as illustrated in FIG. 13C, then the wafer processing apparatus 2 stops processing the frame unit U. Accordingly, when the wafer 4 is diced into individual device chips including the respective devices 14 in a subsequent step, the devices 14 are prevented from suffering defects.

As illustrated in FIG. 11, the temporary rest table 204 is spaced from the wafer table 12 along the X-axis. According to the illustrated embodiment, the temporary rest table 204 includes an annular support 226 for supporting the outer circumferential excess region 20 of the wafer 4 of a frame unit U out of contact with the device region 18 that extends radially inwardly of the outer circumferential excess region 20, and a frame support 228 disposed around the annular support 226 for supporting the frame 64.

The temporary rest table 204 has a circular cavity 230 defined therein radially inwardly of the annular support 226 and opening upwardly. The circular cavity 230 is recessed downwardly from an upper surface of the annular support 226. The frame support 228 of the temporary rest table 204 preferably includes a heater, not illustrated, for heating the tape 96 of the frame unit U temporarily placed on the temporary rest table 204. When the heater heats the tape 96, the tape 96 is softened and hence brought into closer contact with the base of the ring-shaped stiffener 24 under the atmospheric pressure.

According to the illustrated embodiment, the wafer processing apparatus 2 includes a temporary rest table delivery mechanism 232 for delivering the temporary rest table 204 along the Y-axis. The temporary rest table delivery mechanism 232 includes a Y-axis guide member 234 extending along the Y-axis, a Y-axis movable member 236 movably supported on the Y-axis guide member 234 for movement along the Y-axis, and a Y-axis feeding mechanism 238 for moving the Y-axis movable member 236 along the Y-axis. The temporary rest table 204 is fixedly mounted on an upper surface of the Y-axis movable member 236. The Y-axis feeding mechanism 238 includes a ball screw 240 operatively coupled to the Y-axis movable member 236 and extending along the Y-axis and an electric motor 242 connected to one end of the ball screw 240 for rotating the ball screw 240 about its central axis. The temporary rest table delivery mechanism 232 delivers the Y-axis movable member 236 together with the temporary rest table 204 along the Y-axis by converting rotary motion of the electric motor 242 to linear motion with the ball screw 240 and transmitting the linear motion to the Y-axis movable member 236.

As illustrated in FIGS. 1 and 11, the stiffener removing unit 194 includes a laser beam applying unit 244 for applying a laser beam to the base of the ring-shaped stiffener 24 on an outer circumferential edge portion of the wafer 4 to form a cut groove, to be described later, therein, a first lifting and lowering table 246 (see FIG. 1) for holding a frame unit U temporarily placed on the temporary rest table 204, lifting the frame unit U, moving the frame unit U along the X-axis, and positioning the frame unit U over the laser beam applying unit 244, and a separator 248 for separating the ring-shaped stiffener 24 from the cut groove.

As illustrated in FIG. 11, the laser beam applying unit 244 includes a housing 250 disposed adjacent to the temporary rest table 204 along the X-axis, a laser oscillator, not illustrated, housed in the housing 250 for generating a laser beam, a beam condenser 252 for focusing the laser beam generated by the laser oscillator and applying the focused laser beam to the base of the ring-shaped stiffener 24 on the outer circumferential edge portion of the wafer 4, a suction nozzle 254 for drawing in debris produced from the wafer 4 when the laser beam is applied thereto, and a suction source, not illustrated, connected to the suction nozzle 254.

The beam condenser 252 extends obliquely upwardly from an upper surface of the housing 250 toward the suction nozzle 254, so that debris produced from the wafer 4 when the laser beam is applied thereto will not drop onto the beam condenser 252. The suction nozzle 254 similarly extends obliquely upwardly from the upper surface of the housing 250 toward the beam condenser 252.

As illustrated in FIG. 14, while the first lifting and lowering table 246 that is holding a frame unit U is being rotated to rotate the frame unit U, the laser beam applying unit 244 applies a laser beam LB to the base of the ring-shaped stiffener 24 on the outer circumferential edge portion of the wafer 4, forming a ring-shaped cut groove 256 in the wafer 4 along the ring-shaped stiffener 24 by way of ablation. The suction nozzle 254 draws in debris produced from the wafer 4 by the laser beam LB applied from the laser beam applying unit 244 to the wafer 4 by way of ablation.

Figure 15:
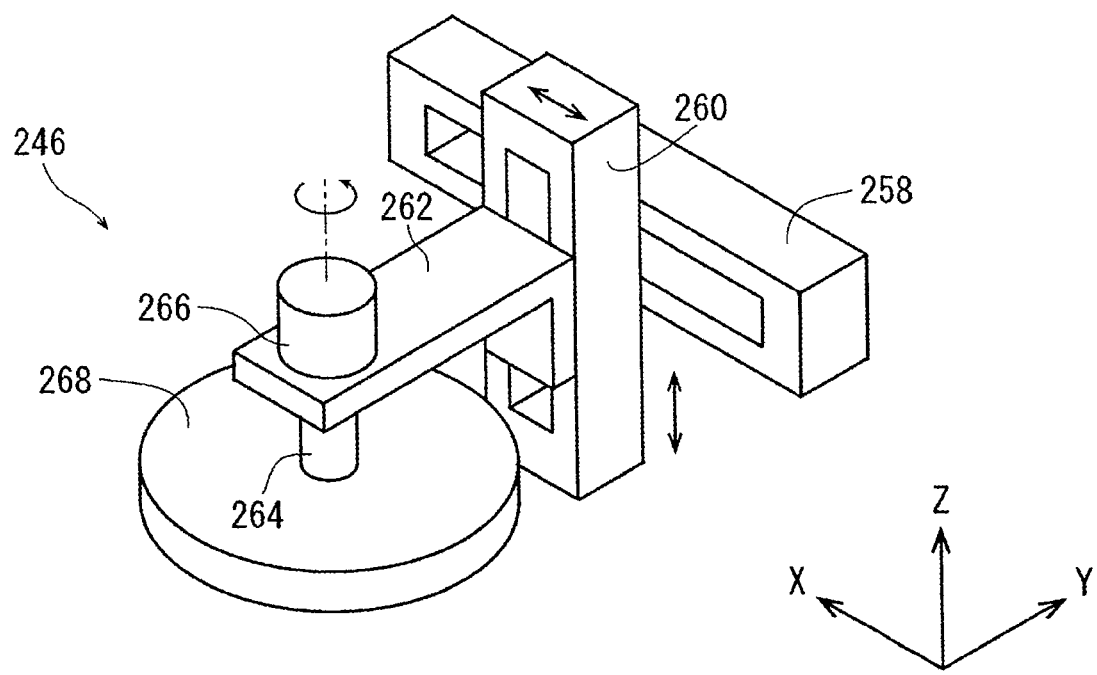
FIG. 15 is a perspective view of a first lifting and lowering table of the stiffener removing unit illustrated in FIG. 1.

As illustrated in FIG. 1, the first lifting and lowering table 246 is movably disposed above the temporary rest table 204 for movement along the X-axis and the Z-axis. As illustrated in FIG. 15, the first lifting and lowering table 246 includes an X-axis guide member 258 fixed to a suitable bracket, not illustrated, and extending along the X-axis, an X-axis movable member 260 movably supported on the X-axis guide member 258 for movement along the X-axis, an X-axis feeding mechanism, not illustrated, for moving the X-axis movable member 260 along the X-axis, a Z-axis movable member 262 movably supported on the X-axis movable member 260 for movement along the Z-axis, and a Z-axis feeding mechanism, not illustrated, for moving the Z-axis movable member 262 along the Z-axis. Each of the X-axis feeding mechanism and the Z-axis feeding mechanism of the first lifting and lowering table 246 has a ball screw and an electric motor for rotating the ball screw about its central axis, for example.

A support shaft 264 extending downwardly is rotatably supported on a lower surface of a distal end of the Z-axis movable member 262. An electric motor 266 for rotating the support shaft 264 about an axis extending along the Z-axis is mounted on an upper surface of the distal end of the Z-axis movable member 262. A circular attractive member 268 is fixed to a lower end of the support shaft 264. The attractive member 268 has a plurality of suction holes, not illustrated, defined therein at circumferentially spaced intervals on a circumference corresponding to the size of the frame 64 and opening at a lower surface thereof. The suction holes are connected to a suction source.

After the heater of the frame support 228 of the temporary rest table 204 has heated the tape 96 of a frame unit U to bring the tape 96 into intimate contact with the base of the ring-shaped stiffener 24 and the attractive member 268 has held the frame 64 of the frame unit U under suction, the X-axis feeding mechanism moves the X-axis movable member 260 along the X-axis to position the frame unit U over the laser beam applying unit 244, and the Z-axis feeding mechanism moves the Z-axis movable member 262 to lift the frame unit U. In a case where the frame 64 is made of a magnetic material, an electromagnet, not illustrated, may be attached to the lower surface of the attractive member 268 to magnetically attract the frame 64 to the attractive member 268.

When the laser beam applying unit 244 applies the laser beam LB to the wafer 4, the electric motor 266 is energized to rotate the frame unit U held by the attractive member 268 under suction. After the cut groove 256 has been formed in the wafer 4 at the base of the ring-shaped stiffener 24, the first lifting and lowering table 246 moves the frame unit U along the X-axis and the Z-axis and temporarily places the frame unit U on the temporary rest table 204.

Figure 16A:
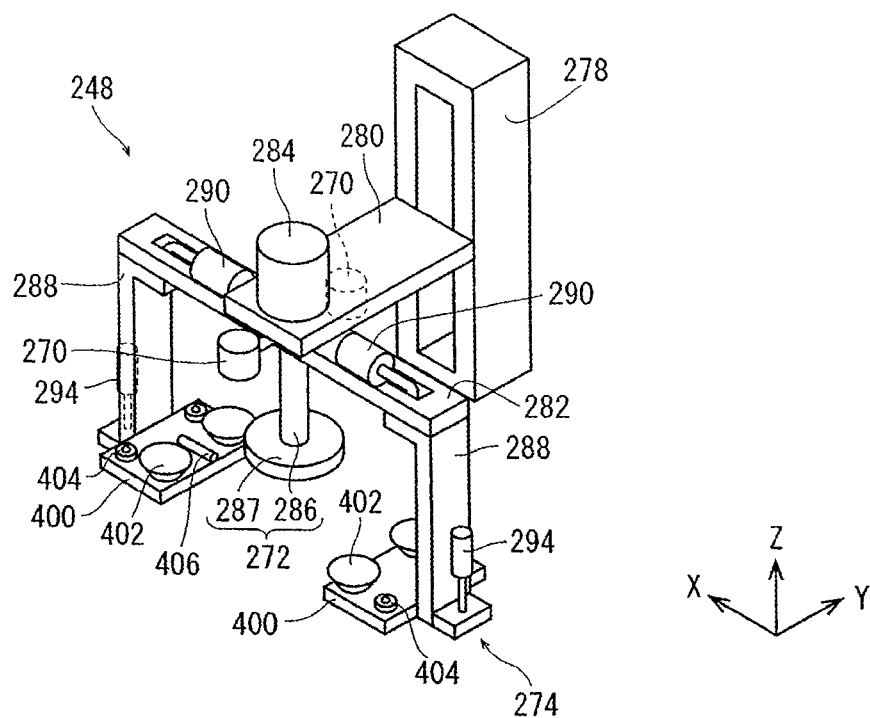
FIG. 16A is a perspective view of a separator of the stiffener removing unit illustrated in FIG. 1.
Figure 16B:
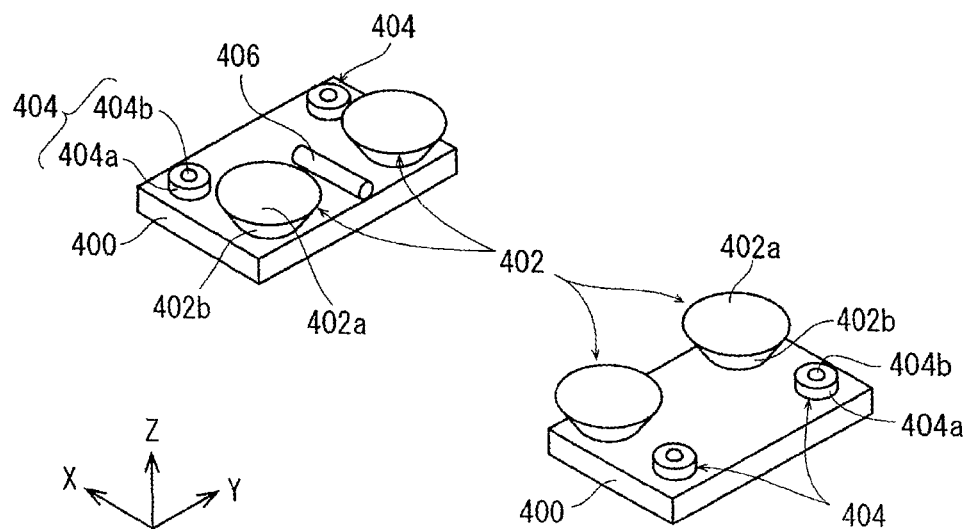
FIG. 16B is an enlarged perspective view of support base plates illustrated in FIG. 16A.
Figure 17:
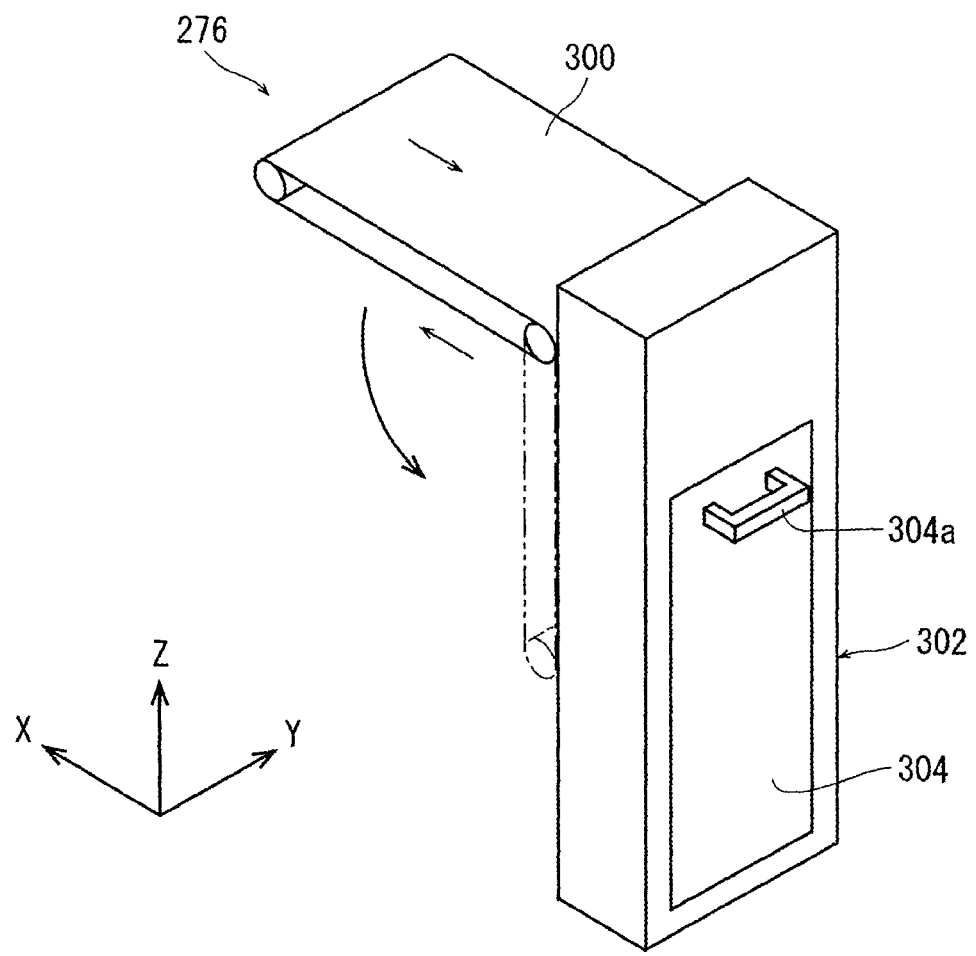
FIG. 17 is a perspective view of a disposer of the stiffener removing unit illustrated in FIG. 1.

As illustrated in FIG. 1, the separator 248 is spaced from the first lifting and lowering table 246 along the Y-axis within the movable range of the temporary rest table 204 along the Y-axis. As illustrated in FIGS. 16A, 16B, and 17, the separator 248 includes a pair of ultraviolet radiation applying units 270 (see FIG. 16A) for applying an ultraviolet radiation to a region of the tape 96 corresponding to the cut groove 256, particularly to a region radially outward of the cut groove 256, to locally reduce the adhesive power of the tape 96, a second lifting and lowering table 272 (see FIG. 16A) for holding an inner area of the wafer 4 under suction while exposing the ring-shaped stiffener 24 radially outwardly, a separating unit 274 (see FIGS. 16A and 16B) for separating the ring-shaped stiffener 24 by causing wedge disks 402 that have respective wedges to act on an outer circumferential surface of the ring-shaped stiffener 24, and a disposer 276 (see FIG. 17) for disposing of the separated ring-shaped stiffener 24.

According to the illustrated embodiment, as illustrated in FIG. 16A, the separator 248 includes a Z-axis guide member 278 fixed to a suitable bracket, not illustrated, and extending along the Z-axis, a Z-axis movable member 280 movably supported by the Z-axis guide member 278 for movement along the Z-axis, and a lifting and lowering mechanism, not illustrated, for moving the Z-axis movable member 280 along the Z-axis. The lifting and lowering mechanism has, for example, a ball screw operatively coupled to the Z-axis movable member 280 and extending along the Z-axis and an electric motor for rotating the ball screw about its central axis.

A support bar 282 is supported on a lower surface of a distal end of the Z-axis movable member 280. The second lifting and lowering table 272 is also rotatably supported on the lower surface of the distal end of the Z-axis movable member 280. An electric motor 284 for rotating the second lifting and lowering table 272 about its central axis is mounted on an upper surface of the distal end of the Z-axis movable member 280. According to the illustrated embodiment, the ultraviolet radiation applying units 270 that are spaced from each other along the Y-axis are supported on the support bar 282.

The second lifting and lowering table 272 has a support shaft 286 extending downwardly from the lower surface of the distal end of the Z-axis movable member 280 and a circular table head 287 removably mounted on a lower end of the support shaft 286. The table head 287 has a plurality of suction holes, not illustrated, defined therein and opening at a lower surface thereof, the suction holes being connected to a suction source, not illustrated.

The separating unit 274 is mounted on the support bar 282. The separating unit 274 includes a pair of movable members 288 spaced from each other and movably disposed on a lower surface of the support bar 282 for movement longitudinally of the support bar 282, a pair of feeding mechanisms 290 for moving the movable members 288 longitudinally of the support bar 282, a pair of support boards 400 vertically movably supported on the respective movable members 288, and a pair of Z-axis feeding mechanisms 294 for vertically moving the support boards 400 along the Z-axis. Each of the feeding mechanisms 290 and the Z-axis feeding mechanisms 294 may include a suitable actuator such as a pneumatic actuator or an electric actuator, for example.

As illustrated in FIGS. 16A and 16B, two rotatable wedge disks 402 having respective wedges, a pair of frame supports 404 for supporting a frame 64, and an ionizer 406 for removing electrostatic charges from a frame unit U are mounted on an upper surface of each of the support boards 400.

Each of the wedge disks 402 is of an inverted frustoconical shape whose diameter is progressively smaller downwardly, and has an upper surface 402a and a side surface 402b that jointly make up a wedge. The wedge disks 402 on the upper surface of each of the support boards 400 are spaced from each other along the Y-axis and rotatably supported on the support board 400 for rotation about a central axis extending along the Z-axis.

The frame supports 404 are disposed on the upper surface of each of the support boards 400 adjacent to the respective wedge disks 402. Each of the frame supports 404 has a housing 404a fixed to the support board 400 and a spherical body 404b rotatably supported on the housing 404a. The spherical body 404b of each of the frame supports 404 supports the frame 64 thereon.

The ionizer 406 on each of the support boards 400 is disposed adjacent to the wedge disks 402. The ionizer 406 removes electrostatic charges from the frame unit U by applying ionized air to the frame unit U.

As illustrated in FIG. 17, the disposer 276 includes a belt conveyor 300 for delivering a separated ring-shaped stiffener 24 and a dust box 302 for retrieving the ring-shaped stiffener 24 delivered by the belt conveyor 300. The belt conveyor 300 is angularly movable by a suitable actuator, not illustrated, between a retrieval position indicated by solid lines in FIG. 17 where the belt conveyor 300 extends substantially horizontally and a standby position indicated by two-dot-and-dash lines in FIG. 17 where the belt conveyor 300 extends substantially vertically.

The dust box 302 has a hinged door 304 with a handle 304a attached to a front surface thereof that faces toward the viewer of FIG. 17 along the X-axis. The dust box 302 houses therein a crusher, not illustrated, for crushing the retrieved ring-shaped stiffener 24. When the operator grips and pulls the handle 304a to open the hinged door 304, the operator can taken out the crushed fragments of the ring-shaped stiffener 24 from the dust box 302.

Figure 18:
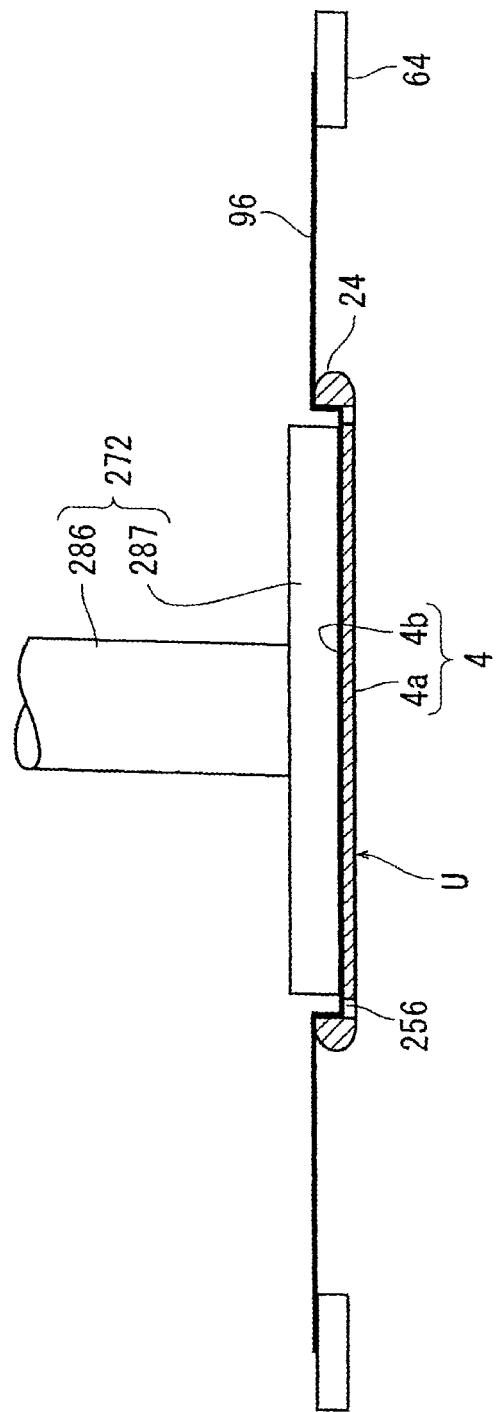
FIG. 18 is an elevational view, partly in cross section, illustrating a manner in which a wafer is held under suction on a second lifting and lowering table in a stiffener removing step.
Figure 19:
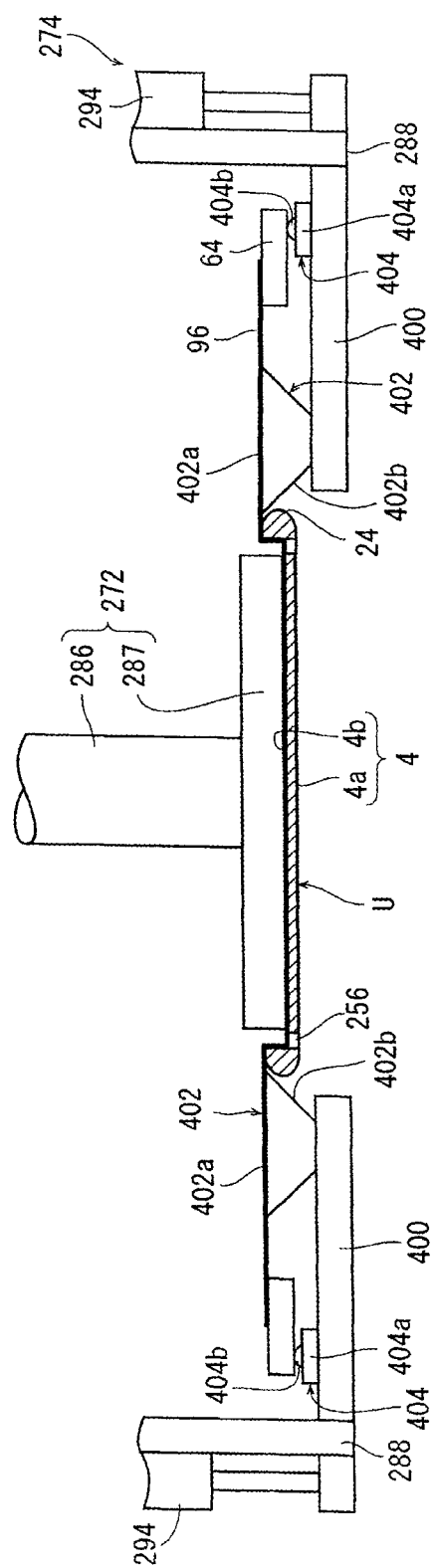
FIG. 19 is an elevational view, partly in cross section, illustrating a manner in which wedge disks of the stiffener removing unit are acting on an outer circumferential portion of the ring-shaped stiffener in the stiffener removing step.

The separator 248 operates as follows. When the temporary rest table 204 on which a frame unit U with a cut groove 256 formed at the base of a ring-shaped stiffener 24 is temporarily placed is positioned below the separator 248 by the temporary rest table delivery mechanism 232, the second lifting and lowering table 272 holds under suction an inner area of the wafer 4 while exposing the ring-shaped stiffener 24 radially outwardly, as illustrated in FIG. 18. Then, the feeding mechanisms 290 move the movable members 288, and the Z-axis feeding mechanisms 294 move the support boards 400 to cause the wedge disks 402 to act on the outer circumferential surface of the ring-shaped stiffener 24, as illustrated in FIG. 19. Specifically, the wedges of the wedge disks 402 are positioned between the tape 96 and the ring-shaped stiffener 24. The frame 64 has its lower surface brought into contact with the spherical bodies 404b of the frame supports 404, so that the spherical bodies 404b support the frame 64.

Figure 20:
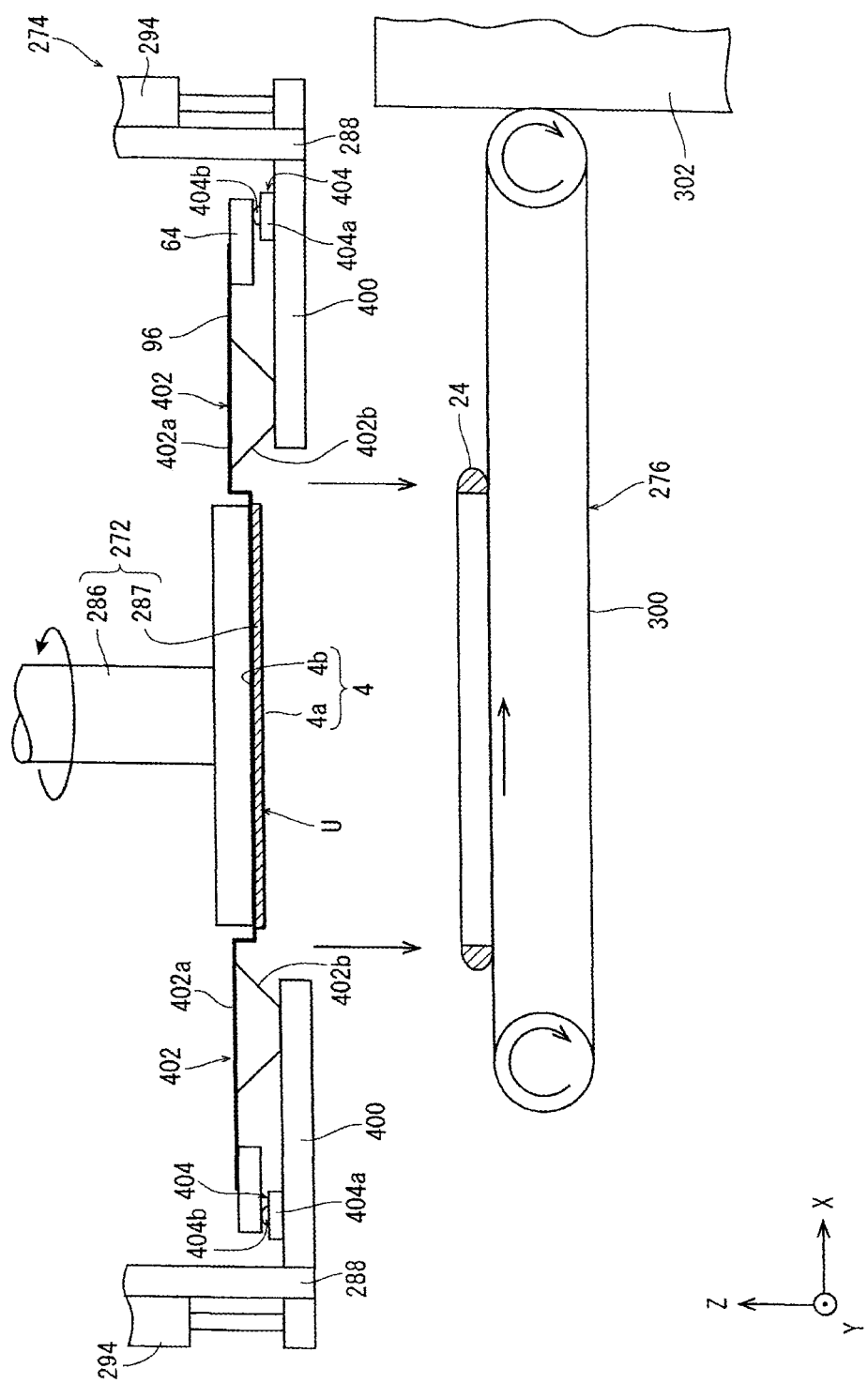
FIG. 20 is an elevational view, partly in cross section, illustrating a manner in which the ring-shaped stiffener has been separated from the wafer in the stiffener removing step.

Then, the ultraviolet radiation applying units 270 apply an ultraviolet radiation to the tape 96 affixed to the ring-shaped stiffener 24 to reduce the adhesive power of the tape 96, and the electric motor 284 rotates the second lifting and lowering table 272 together with the frame unit U with respect to the separating unit 274. Since the tape 96 with the reduced adhesive power and the ring-shaped stiffener 24 are now separated from each other by the wedges of the wedge disks 402, the ring-shaped stiffener 24 can be separated from the frame unit U, as illustrated in FIG. 20. The separated ring-shaped stiffener 24 is delivered by the belt conveyor 300 to the dust box 302 and retrieved in the dust box 302. For separating the ring-shaped stiffener 24, the separating unit 274 may alternatively be rotated with respect to the frame unit U.

At the time the ring-shaped stiffener 24 is separated, the ionizer 406 applies ionized air to the frame unit U. The applied ionized air removes electrostatic charges produced when the wedge disks 402 contact the tape 96 and the ring-shaped stiffener 24. Consequently, the tape 96 and the ring-shaped stiffener 24 are prevented from being electrostatically attracted to each other, allowing the ring-shaped stiffener 24 to reliably be separated from the frame unit U.

When the ring-shaped stiffener 24 is separated, the wedge disks 402 acting on the frame unit U are rotated about their central axes and the spherical bodies 404b contacting the lower surface of the frame 64 are rotated due to the relative rotation of the frame unit U and the separating unit 274. Therefore, the frame unit U and the separating unit 274 are smoothly rotated relatively to each other.

As illustrated in FIG. 1, the stiffener-free frame unit unloading mechanism 196 is disposed adjacent to the stiffener removing unit 194. According to the illustrated embodiment, as illustrated in FIGS. 21 and 22, the stiffener-free frame unit unloading mechanism 196 includes an inverting mechanism 308 (see FIG. 21) having a frame holder 306 for facing a stiffener-free frame unit supported on the second lifting and lowering table 272 and holding the frame 64 thereof, the inverting mechanism 308 being movable toward the frame cassette table 200 and capable of inverting the frame holder 306, a stiffener-free frame unit support 310 (see FIG. 22) for supporting a stiffener-free frame unit that has been inverted by the inverting mechanism 308 to orient the face side 4a of the wafer 4 upwardly, and a pusher 312 (see FIG. 22) for pushing a stiffener-free frame unit supported on the stiffener-free frame unit support 310 into the frame cassette 198 placed on the frame cassette table 200.

Figure 21:
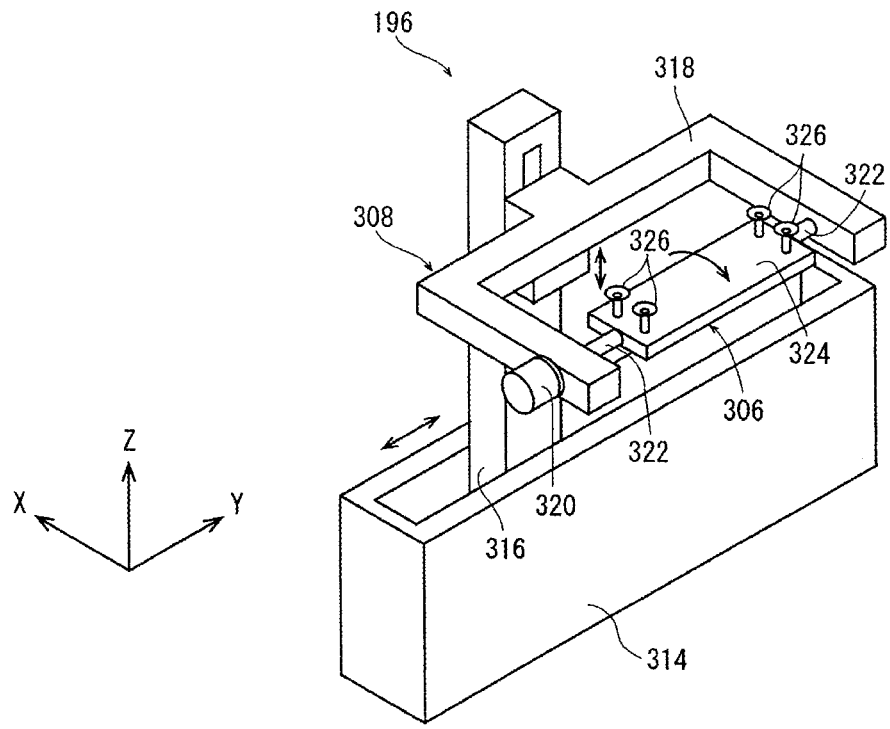
FIG. 21 is a perspective view of an inverting mechanism of a stiffener-free frame unit unloading mechanism of the wafer processing apparatus illustrated in FIG. 1.
Figure 22:
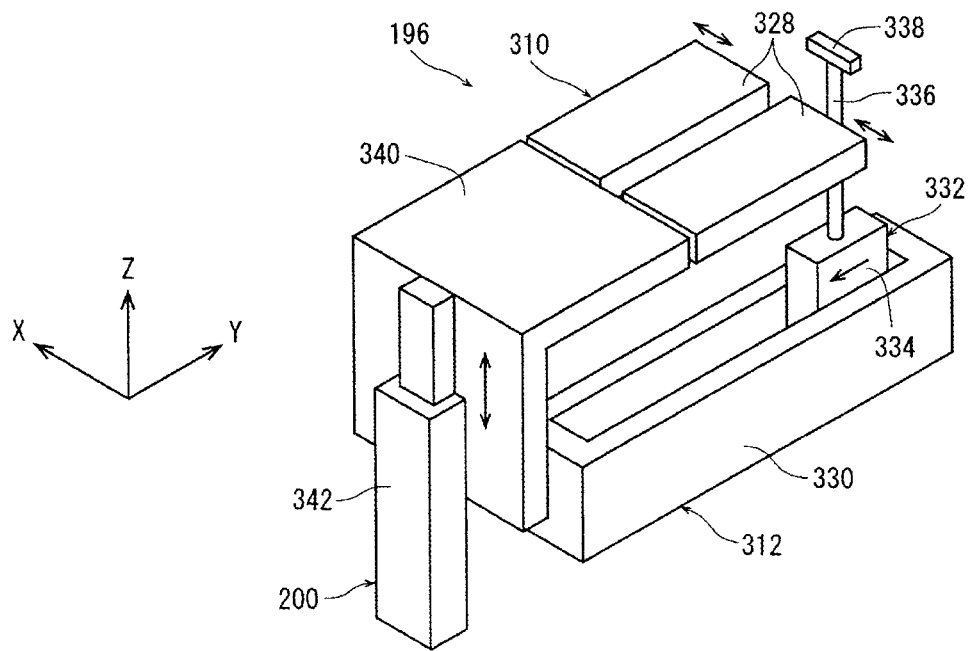
FIG. 22 is a perspective view of a stiffener-free frame unit support and a pusher of the stiffener-free frame unit unloading mechanism.

As illustrated in FIG. 21, the inverting mechanism 308 includes a Y-axis guide member 314 extending along the Y-axis, a Y-axis movable member 316 movably supported on the Y-axis guide member 314 for movement along the Y-axis, a Y-axis feeding mechanism, not illustrated, for moving the Y-axis movable member 316 along the Y-axis, an arm 318 movably supported on the Y-axis movable member 316 for movement along the Z-axis, and a Z-axis feeding mechanism, not illustrated, for moving the arm 318 along the Z-axis. Each of the Y-axis and Z-axis feeding mechanisms of the inverting mechanism 308 has a ball screw and an electric motor for rotating the ball screw about its central axis, for example.

The frame holder 306 is vertically invertibly supported on the arm 318. An electric motor 320 for vertically inverting the frame holder 306 is also mounted on the arm 318. According to the illustrated embodiment, the frame holder 306 includes a base plate 324 rotatably supported on the arm 318 by a pair of rotational shafts 322 and a plurality of suction pads 326 disposed on one surface of the base plate 324 and connected to a suction source, not illustrated. One of the rotational shafts 322 is coupled to the electric motor 320.

The inverting mechanism 308 operates as follows. The suction pads 326 that face upwardly attract and hold under suction a lower surface of the frame 64 of a stiffener-free frame unit U' supported on the second lifting and lowering table 272, so that the inverting mechanism 308 receives the stiffener-free frame unit U' from the second lifting and lowering table 272. Then, the electric motor 320 vertically inverts the frame holder 306 to orient the face side 4a of the wafer 4 upwardly. Thereafter, the Y-axis feeding mechanism moves the Y-axis movable member 316 along the Y-axis, moving the stiffener-free frame unit U' held on the frame holder 306 toward the frame cassette table 200.

As illustrated in FIG. 22, the stiffener-free frame unit support 310 according to the illustrated embodiment includes a pair of support plates 328 movably supported on a suitable bracket, not illustrated, for movement along the X-axis and an interval adjusting mechanism, not illustrated, for adjusting the interval between the support plates 328 along the X-axis. The interval adjusting mechanism may include a suitable actuator such as a pneumatic actuator or an electric actuator, for example.

Heaters, not illustrated, are combined with the respective support plates 328 that will support a stiffener-free frame unit U' thereon. When the interval between the support plates 328 is reduced and a stiffener-free frame unit U' is supported on the support plates 328, the heaters combined with the support plates 328 are energized to heat the tape 96 of the stiffener-free frame unit U', thereby eliminating slack and wrinkles that may have been caused in the tape 96 upon the removal of the ring-shaped stiffener 24.

As illustrated in FIG. 22, the pusher 312 according to the illustrated embodiment includes a Y-axis guide member 330 extending along the Y-axis, a Y-axis movable member 332 movably supported on the Y-axis guide member 330 for movement along the Y-axis, and a Y-axis feeding mechanism, not illustrated, for moving the Y-axis movable member 332 along the Y-axis. The Y-axis movable member 332 includes a base 334 supported on the Y-axis guide member 330, a post 336 extending upwardly from an upper surface of the base 334, and a presser 338 attached to an upper end of the post 336. The Y-axis feeding mechanism of the pusher 312 has a ball screw coupled to the Y-axis movable member 322 and extending along the Y-axis and an electric motor for rotating the ball screw about its central axis, for example.

Figure 23:
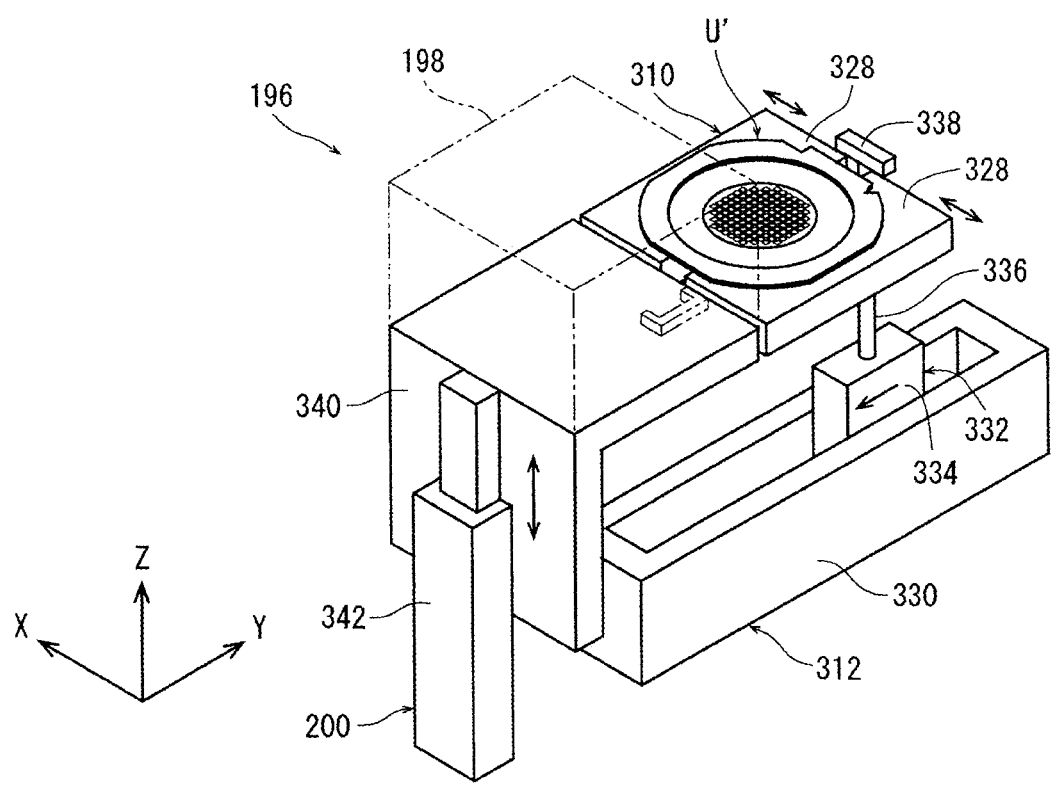
FIG. 23 is a perspective view illustrating a manner in which a stiffener-free frame unit storing step is being carried out.

As illustrated in FIG. 23, before the stiffener-free frame unit support 310 receives a stiffener-free frame unit U', the interval adjusting mechanism increases the interval of the support plates 328. Then, the stiffener-free frame unit support 310 receives a stiffener-free frame unit U' from the suction pads 326 onto the support plates 328. When the stiffener-free frame unit support 310 has received the stiffener-free frame unit U', the Y-axis feeding mechanism moves the Y-axis movable member 332 along the Y-axis to cause the presser 338 to press the stiffener-free frame unit U' on and along the support plates 328 into the frame cassette 198 placed on the frame cassette table 200.

The frame cassette 198 illustrated in FIGS. 1 and 23 stores therein a plurality of stiffener-free frame units U' at vertically spaced intervals with the face sides 4a of the wafers 4 facing upwardly. As illustrated in FIGS. 22 and 23, the frame cassette table 200 includes a rest plate 340 for placing the frame cassette 198 thereon and a lifting and lowering unit 342 for lifting and lowering the rest plate 340 and positioning the rest plate 340 at a desired height. The lifting and lowering unit 342 has, for example, a ball screw coupled to the rest plate 340 and extending along the Z-axis and an electric motor for rotating the ball screw about its central axis.

The method of processing a wafer according to the present embodiment will be described below. In the illustrated embodiment, the wafer processing apparatus 2 described above is used to carry out the method of processing a wafer. The present invention, however, is not limited to the method of processing a wafer using the wafer processing apparatus 2.

According to the illustrated embodiment, a wafer preparing step is carried out to prepare a wafer having a protrusive ring-shaped stiffener on its reverse side in an outer circumferential excess region thereof. The wafer to be prepared in the wafer preparing step is represented by the wafer 4 (see FIG. 2) described above, for example. It is preferable to prepare a plurality of wafers 4 in the wafer preparing step. After the wafers 4 have been prepared, they are stored in the wafer cassette 6 at vertically spaced intervals with their face sides 4a facing upwardly (see FIGS. 1 and 3). The wafer cassette 6 with the wafers 4 stored therein is placed on the wafer cassette table 8.

A frame preparing step is also carried out to prepare a ring-shaped frame having an opening for accommodating a wafer therein. The frame to be prepared in the frame preparing step is represented by the frame (see FIG. 5) described above, for example. It is preferable to prepare a plurality of frames 64. The frame preparing step may be carried out before or after the wafer preparing step.

After the frames 64 have been prepared, the lifting and lowering mechanism lowers the lifting and lowering plate 74 of the frame storage unit 66 to a desired height, and then the operator grips and pulls the handle 76a to open the door 76 and places a stack of the frames 64 on the upper surface of the lifting and lowering plate 74 in the housing 72. The height of the lifting and lowering plate 74 is suitably adjusted to position the uppermost one of the frames 64 at a position where it can be unloaded from the housing 72 by the frame unloading mechanism 68.

The wafer preparing step and the frame preparing step are followed by a frame unit producing step of producing a frame unit U by affixing a tape 96 to the frame 64 and the reverse side 4b of the wafer 4. In the frame unit producing step, a wafer unloading step is carried out to unload a wafer 4 from the wafer cassette 6 placed on the wafer cassette table 8.

In the wafer unloading step, as illustrated in FIG. 3, the Y-axis feeding mechanism 34 of the wafer unloading mechanism 10 is actuated to position the Y-axis movable member 32 closely to the wafer cassette table 8. Then, the delivery arm 42 is actuated to position the hand 44 with the air ejection ports 46 oriented upwardly beneath the reverse side 4b of a wafer 4 in the wafer cassette 6. At this time, the hand 44 is spaced from the reverse side 4b of the wafer 4, and the guide pins 48 are positioned radially outwardly of the wafer 4.

Then, the air ejection ports 46 in the hand 44 eject compressed air to develop a negative pressure on the upper surface of the hand 44 owing to the Bernoulli's principle, thereby enabling the hand 44 to attract and hold the wafer 4 under suction out of contact with the reverse side 4b. Then, the guide pins 48 are moved radially inwardly into contact with the outer circumferential edge of the wafer 4, thereby limiting the wafer 4 supported under suction over the hand 44 against horizontal movement. The Y-axis movable member 32 and the delivery arm 42 of the wafer unloading mechanism 10 are moved to unload the wafer 4 supported under suction over the hand 44 from the wafer cassette 6.

After the wafer unloading step, it is preferable to carry out a notch detecting step to detect the position of the notch 26 of the wafer 4. In the notch detecting step, as illustrated in FIG. 4, the outer circumferential edge portion of the wafer 4 supported under suction over the hand 44 is positioned between the light emitter 52 and the light detector 54 of the notch detecting unit 50. Then, the rotary actuator is energized to rotate the guide pins 48 and hence the wafer 4 until the notch detecting unit 50 detects the position of the notch 26. It is thus possible to adjust the orientation of the wafer 4 to a desired direction.

After the notch detecting step, a wafer supporting step is carried out to support the face side 4a of the wafer 4 unloaded by the wafer unloading mechanism 10 on the wafer table 12.

In the wafer supporting step, as illustrated in FIG. 3, the hand 44 of the wafer unloading mechanism 10 is inverted upside down to orient the face side 4a of the wafer 4 upwardly. Then, the Y-axis movable member 32 and the delivery arm 42 of the wafer unloading mechanism 10 are moved to bring the outer circumferential excess region 20 of the face side 4a of the wafer 4 supported under suction over the hand 44 into contact with the annular support 56 of the wafer table 12. At this time, since the device region 18 of the face side 4a of the wafer 4 is positioned over the cavity 62 in the wafer table 12, the devices 14 of the wafer 4 are held out of contact with the wafer table 12 and hence are prevented from being damaged thereby.

Then, the suction source of the wafer table 12 is actuated to generate and transmit a suction force to the suction holes 60, thereby enabling the suction holes 60 to hold the outer circumferential excess region 20 of the face side 4a of the wafer 4 under suction. Then, the hand 44 stops applying the suction force to the wafer 4 and is moved away from the wafer table 12. In this manner, the wafer 4 is transferred from the wafer unloading mechanism 10 to the wafer table 12. The wafer 4 transferred to the wafer table 12 is held in position by the suction force from the suction holes 60 and is prevented from being shifted in position on the wafer table 12.

In the frame unit producing step, a frame unloading step is carried out to unload a frame 64 from the frame storage unit 66 concurrent with the wafer unloading step and the wafer supporting step.

In the frame unloading step, as illustrated in FIG. 5, the X-axis movable member 84 and the Z-axis movable member 86 of the frame unloading mechanism 68 are moved to bring the suction pads 92 of the holder 88 into contact with the upper surface of an uppermost one of the frames 64 stored in the frame storage unit 66. Then, the suction source of the frame unloading mechanism 68 is actuated to generate a suction force to act on the suction pads 92, so that the suction pads 92 hold the uppermost frame 64 in the frame storage unit 66 under suction. The X-axis movable member 84 and the Z-axis movable member 86 are moved again to unload the uppermost frame 64 held under suction by the suction pads 92 from the frame storage unit 66.

After the frame unloading step, a frame supporting step is carried out to support the frame 64 unloaded the frame storage unit 66 by the frame unloading mechanism 68 on the frame table 70.

In the frame supporting step, as illustrated in FIG. 5, the X-axis movable member 84 and the Z-axis movable member 86 of the frame unloading mechanism 68 are moved to bring the frame 64 held under suction by the suction pads 92 into contact with the upper surface of the frame table 70. At this time, the frame table 70 has been positioned in the lowered position indicated by the solid lines in FIG. 5. Then, the suction force applied from the suction pads 92 of the frame unloading mechanism 68 is eliminated, releasing the frame 64 onto the frame table 70. The X-axis movable member 84 and the Z-axis movable member 86 are moved to space the holder 88 away from above the frame table 70.

After the frame supporting step, a tape affixing step is carried out to affix the tape 96 to the frame 64.

In the tape affixing step, as illustrated in FIGS. 6A and 6B, before the frame table 70 is moved from the lowered position illustrated in FIG. 6A to the lifted position illustrated in FIG. 6B where the tape 96 can be affixed to the frame 64, the tape 96 is paid out from the tape roll 96R and the tape 96 from which the peel-off sheet 116 has been peeled off is positioned above the frame table 70. The tape 96 positioned above the frame table 70 has its adhesive surface facing downwardly.

Then, the frame table 70 is lifted to the lifted position where the presser roller 132 of the pressure-bonding mechanism 110 of the tape affixing unit 98 can press the tape 96 downwardly against the frame 64. While the pressing roller 132 is pressing the adhesive surface of the tape 96 against the frame 64, the presser roller 132 is rollingly moved along the Y-axis. The pressure-bonding mechanism 110 thus pressure-bonds the tape 96 drawn from the tape roll 96R by the tape pay-out mechanism 108 to the frame 64 on the frame table 70.

Then, the cutter 144 and the presser roller 146 of the cutting mechanism 112 of the tape affixing unit 98 are lowered to hold the cutter 144 against the tape 96 on the frame 64 and also to hold the presser roller 146 against the frame 64 through the tape 96. Then, the electric motor 138 is energized to rotate the arm 140, causing the cutter 144 and the presser roller 146 to move in a circle along the frame 64. The cutter 144 now cuts off a portion of the tape 96 that protrudes radially outwardly from the outer circumferential edge of the frame 64 along the frame 64. As the presser roller 146 is pressing the frame 64 through the tape 96, the frame 64 and the tape 96 are prevented from being shifted in position while the cutter 144 is cutting the tape 96. The used tape 96 with the circular opening 120 left therein is wound up by the tape take-up mechanism 106.

After the tape affixing step, a tape-affixed frame delivery step is carried out to deliver the frame 64 to which the tape 96 is affixed to the wafer table 12 and to place the tape-affixed frame 64' on the wafer table 12 such that the opening 64a of the frame 64 is positioned around the reverse side 4b of the wafer 4 supported on the wafer table 12.

In the tape-affixed frame delivery step, first, the frame table 70 is moved from the lifted position to the lowered position. Then, the Y-axis movable member 150 and the Z-axis movable member 152 of the tape-affixed frame delivery mechanism 100 (see FIG. 5) are moved to bring the suction pads 158 of the holder 154 of the tape-affixed frame delivery mechanism 100 into contact with the upper surface of the tape-affixed frame 64' (see FIG. 7) supported on the frame table 70 with the adhesive surface of the tape 96 facing downwardly.

Then, the suction source of the tape-affixed frame delivery mechanism 100 is actuated to generate and transmit a suction force to the suction pads 158, thereby enabling the suction pads 158 to hold the upper surface of the tape-affixed frame 64' under suction. Then, the Y-axis movable member 150 and the Z-axis movable member 152 of the tape-affixed frame delivery mechanism 100 are moved to unload the tape-affixed frame 64' held under suction by the suction pads 158 from the frame table 70.

Then, the tape-affixed frame 64' held under suction by the suction pads 158 of the tape-affixed frame delivery mechanism 100 is delivered to the wafer table 12. As illustrated in FIG. 7, the tape-affixed frame 64' is brought into contact with the frame support 58 of the wafer table 12 with the opening 64a of the frame 64 being positioned around the reverse side 4b of the wafer 4 supported on the wafer table 12. At this time, the adhesive surface of the tape 96 of the tape-affixed frame 64' faces downwardly, and the reverse side 4b of the wafer 4 faces upwardly toward the adhesive surface of the tape 96.

Then, the suction force applied from the suction pads 158 of the tape-affixed frame delivery mechanism 100 is eliminated, releasing and placing the tape-affixed frame 64' onto the frame support 58 of the wafer table 12. Then, the Y-axis movable member 150 and the Z-axis movable member 152 of the tape-affixed frame delivery mechanism 100 are moved to space the holder 154 away from above the wafer table 12.

After the tape-affixed frame delivery step, a tape pressure-bonding step is carried out to pressure-bond the tape 96 of the tape-affixed frame 64' to the reverse side 4b of the wafer 4.

Figure 8:
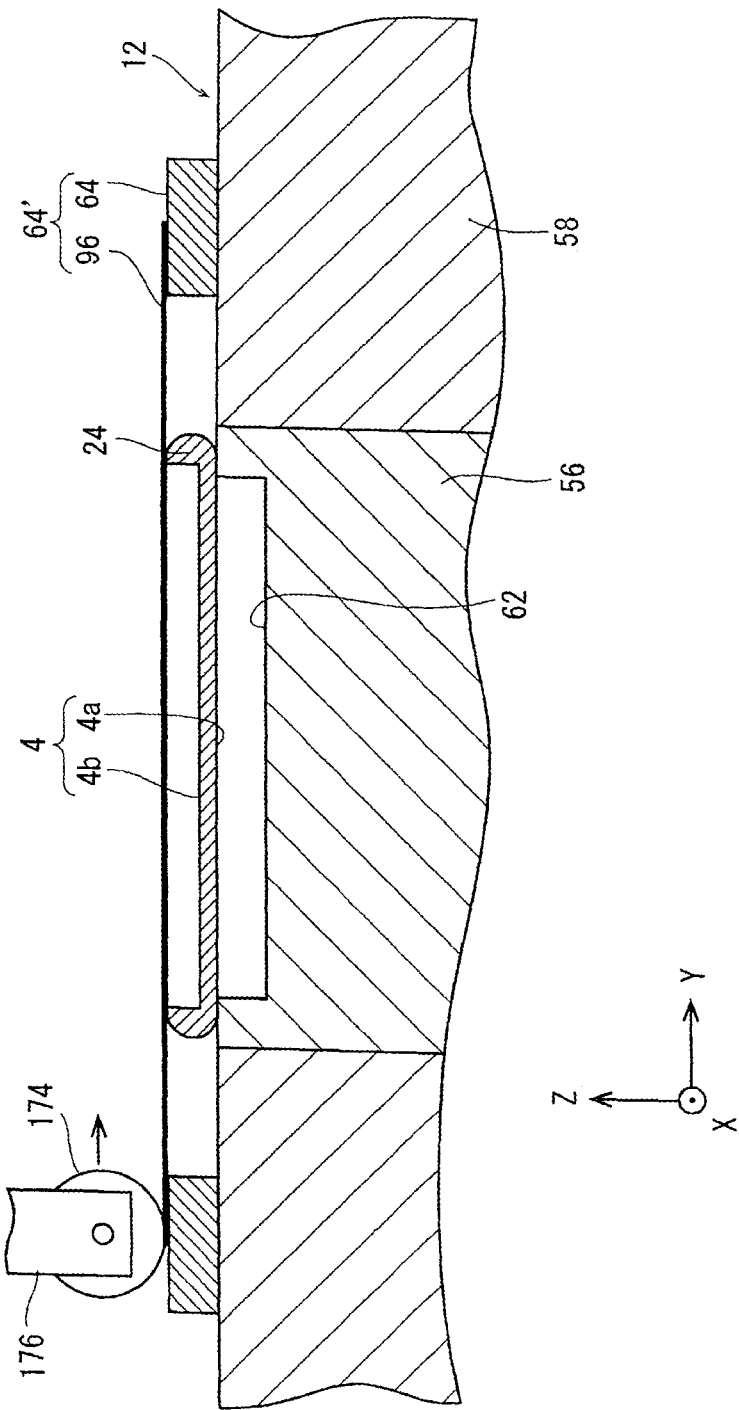
FIG. 8 is a cross-sectional view illustrating a manner in which a presser roller starts pressing a tape in a tape pressure-bonding step.
Figure 9:
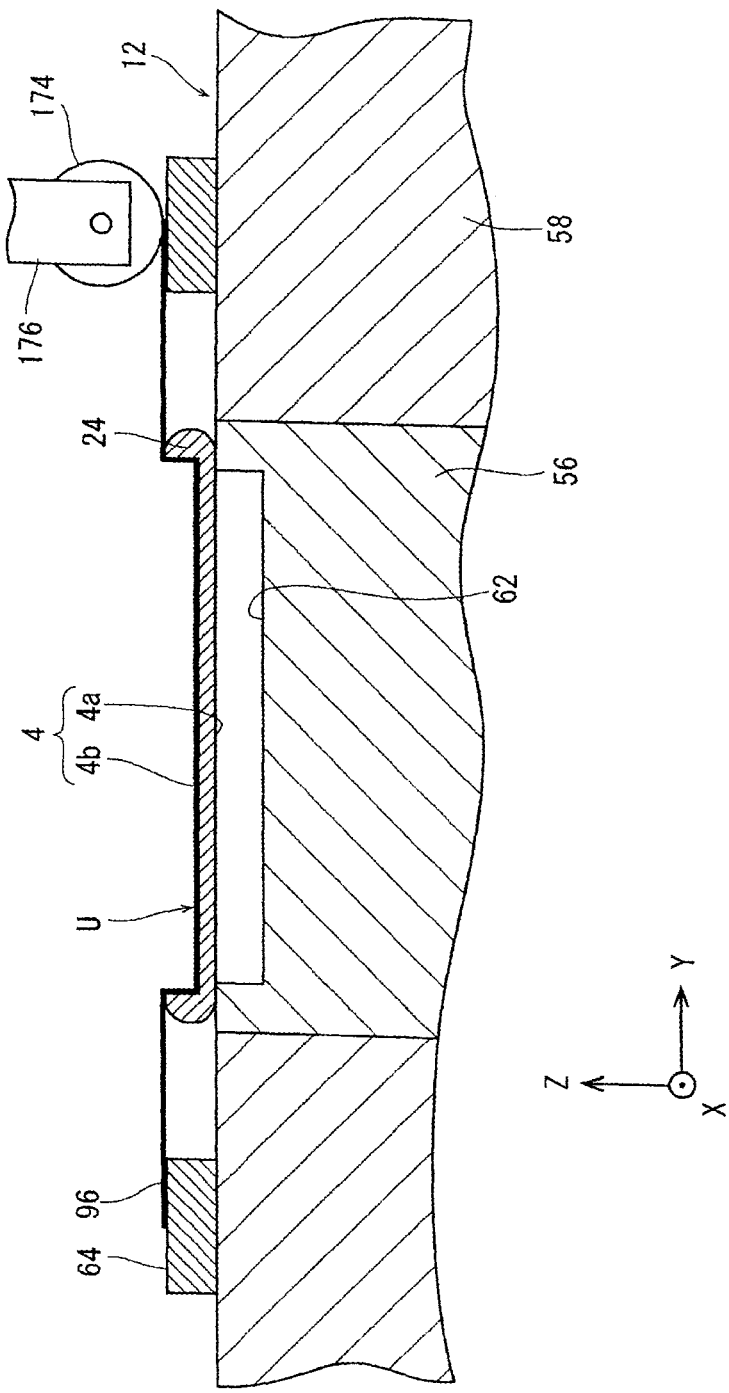
FIG. 9 is a cross-sectional view illustrating a manner in which the presser roller has finished pressing the tape in the tape pressure-bonding step.
Figure 10A:
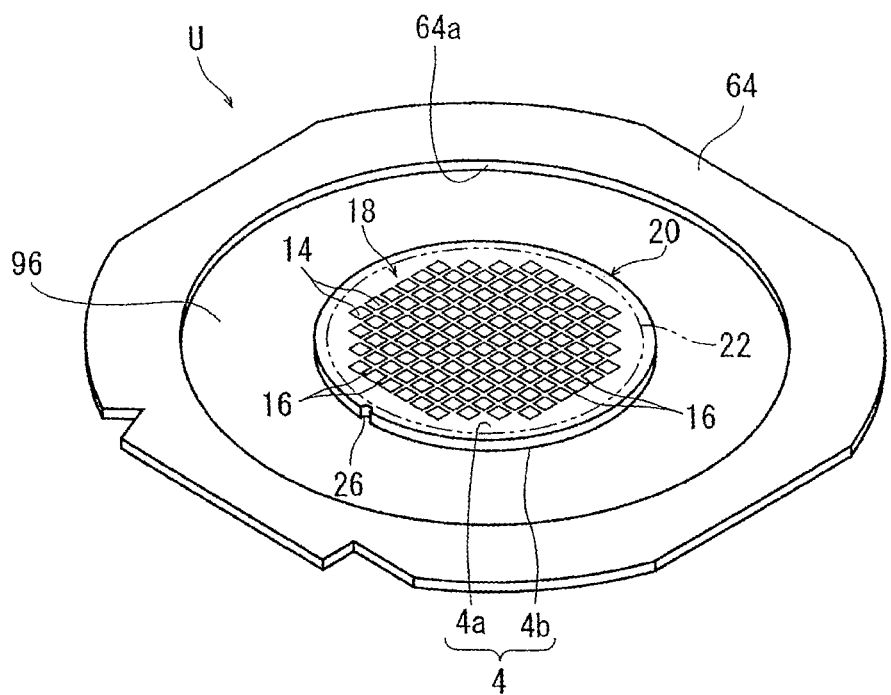
FIG. 10A is a perspective view of a frame unit, illustrating a face side of the wafer.
Figure 10B:
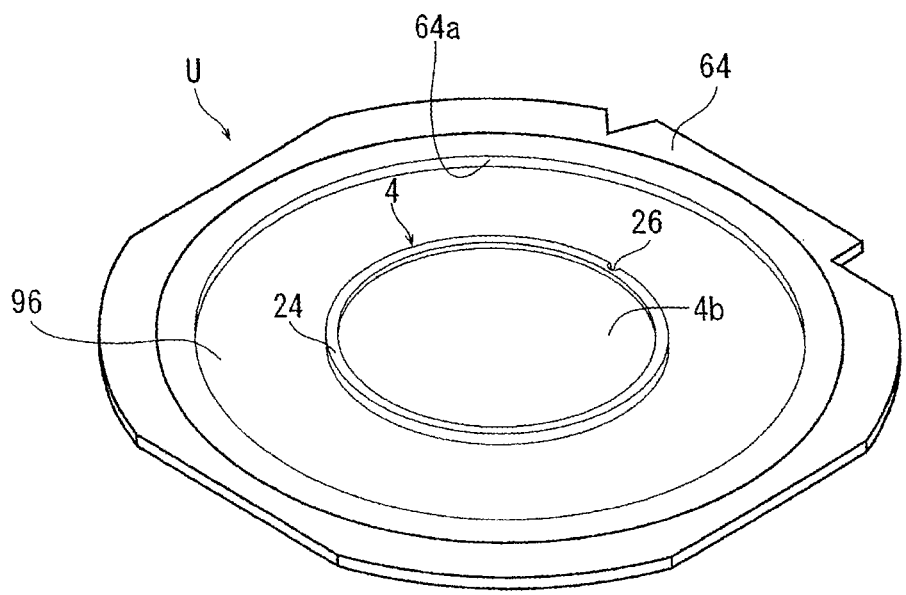
FIG. 10B is a perspective view of the frame unit, illustrating a reverse side of the wafer.

As illustrated in FIGS. 7 through 9, in the tape pressure-bonding step, first, the lifting and lowering mechanism 164 of the tape pressure-bonding unit 102 lowers the upper chamber 160 to bring the lower end of the side wall 172 of the upper chamber 160 into contact with the upper end of the side wall 186 of the lower chamber 162. The upper chamber 160 and the lower chamber 162 are now put into the closed state, and the presser roller 174 is brought into contact with the tape-affixed frame 64'. Then, as illustrated in FIG. 8, the ring-shaped stiffener 24 of the wafer 4 has its upper end affixed to the adhesive surface of the tape 96 of the tape-affixed frame 64'.

Then, the vacuum source 166 of the tape pressure-bonding unit 102 is actuated while the venting device 168 is being closed, evacuating the upper and lower chambers 160 and 162. Thereafter, as illustrated in FIGS. 8 and 9, the Y-axis feeding mechanism 178 rollingly moves the presser roller 174 along the Y-axis as indicated by the arrow in FIG. 8, pressure-bonding the tape 96 to the reverse side 4b of the wafer 4, producing a frame unit U (see FIGS. 10A and 10B) where the reverse side 4b of the wafer 4 and the tape 96 are pressure-bonded to each other. Then, the venting device 168 is opened to cause the atmospheric pressure to bring the tape 96 into intimate contact with the reverse side 4b of the wafer 4 along the base of the ring-shaped stiffener 24. Then, the lifting and lowering mechanism 164 lifts the upper chamber 160 away from the lower chamber 162. In this manner, the frame unit producing step including the wafer unloading step up to the tape pressure-bonding step is carried out.

When the upper chamber 160 and the lower chamber 162 are evacuated, the suction force applied to the wafer 4 by the wafer table 12 is lost. However, inasmuch as the upper end of the ring-shaped stiffener 24 of the wafer 4 is affixed to the adhesive surface of the tape 96 of the tape-affixed frame 64' at the time the upper chamber 160 and the lower chamber 162 are put into the closed state, the wafer 4 is not shifted in position in the tape pressure-bonding step.

After the frame unit producing step, a center setting step is carried out to capture an image of the ring-shaped stiffener 24 and set the center of the inner circumferential circle of the ring-shaped stiffener 24 on the basis of the captured image. In the center setting step, first, a frame unit unloading step is carried out to unload the frame unit U where the tape 96 of the tape-affixed frame 64' and the reverse side 4b of the wafer 4 are pressure-bonded to each other from the wafer table 12.

As illustrated in FIG. 5, in the frame unit unloading step, first, the delivery mechanism 206 of the frame unit unloading mechanism 192 is actuated to bring the lower surface of the suction member 210 of the wafer holder 202a of the frame unit holder assembly 202 into contact with the tape 96 on the reverse side 4b of the wafer 4 and also to bring the suction pads 214 of the frame holder 202b into contact with the frame 64.

Then, the suction source connected to the suction member 210 and the suction pads 214 is actuated to generate and transmit a suction force to the suction member 210 and the suction pads 214, enabling the suction member 210 to hold under suction the inner area of the wafer 4 from the reverse side 4b of the wafer 4 through the tape 96 and enabling the suction pads 214 to hold the frame 64 under suction, while exposing the ring-shaped stiffener 24 radially outwardly. Then, the wafer table 12 stops applying the suction force to the wafer 4, and the delivery mechanism 206 is actuated to unload the frame unit U held by the frame unit holder assembly 202 from the wafer table 12.

After the frame unit unloading step, a center detecting step is carried out to detect the center of the inner circumferential circle of the ring-shaped stiffener 24.

As illustrated in FIGS. 11 and 12, in the center detecting step, first, the frame unit U held by the frame unit holder assembly 202 is positioned between the upper camera 223 and the lower camera 224. Then, the delivery mechanism 206 as the two-dimensional moving mechanism of the frame unit unloading mechanism 192 is actuated, and the upper camera 223 captures an image of at least three portions of the inner circumferential circle of the ring-shaped stiffener 24 from above the frame unit U held by the frame unit holder assembly 202. The coordinates of the at least three portions of the inner circumferential circle of the ring-shaped stiffener 24 are thus measured on the basis of the captured image. Then, the coordinates of the center of the inner circumferential circle of the ring-shaped stiffener 24 are detected on the basis of the measured coordinates of the at least three portions. The detected coordinates of the center of the inner circumferential circle of the ring-shaped stiffener 24 are set as the center of the inner circumferential circle of the ring-shaped stiffener 24.

When the frame unit U is positioned between the upper camera 223 and the lower camera 224, it is preferable to actuate the delivery mechanism 206 and to capture an image of the portion of the face side 4a of the wafer 4 that corresponds to the ring-shaped stiffener 24 with the lower camera 224 from below the frame unit U. It is thus possible to inspect whether there is a device 14 or not in a region where the wafer 4 is to be cut in order to remove the ring-shaped stiffener 24, i.e., in the inner circumferential circle of the ring-shaped stiffener 24.

If there is a device 14 in the region where the wafer 4 is to be cut in order to remove the ring-shaped stiffener 24, then the wafer processing apparatus 2 stops processing the frame unit U. For example, if a device 14 overlaps the ring-shaped stiffener 24 as illustrated in FIG. 13B, then a grinding apparatus, not illustrated, is used to grind the ring-shaped stiffener 24 to reduce the width of the ring-shaped stiffener 24 in order to keep the device 14 from overlapping the ring-shaped stiffener 24. When the wafer 4 is subsequently cut to remove the ring-shaped stiffener 24, the device 14 is prevented from being severed.

When the frame unit U is positioned between the upper camera 223 and the lower camera 224, it is preferable to capture an image of the reverse side 4b of the wafer 4 with the upper camera 223 along the ring-shaped stiffener 24. The wafer processing apparatus 2 stops processing the frame unit U if it has detected a region where the ring-shaped stiffener 24 and the tape 96 are not held in intimate contact with each other on the basis of the captured image. For example, if there is a clearance V between the ring-shaped stiffener 24 and the tape 96 as illustrated in FIG. 13C, then the wafer processing apparatus 2 stops processing the frame unit U. Accordingly, when the wafer 4 is diced into individual device chips including the respective devices 14 in a subsequent step, the devices 14 are prevented from suffering defects.

If there is no device 14 in the region where the wafer 4 is to be cut in order to remove the ring-shaped stiffener 24 (see FIG. 13A) and if any region where the ring-shaped stiffener 24 and the tape 96 are not in intimate contact with each other is not detected, then a temporarily resting step is carried out to actuate the delivery mechanism 206 as the two-dimensional moving mechanism to temporarily place the frame unit U on the temporary rest table 204 such that the center of the inner circumferential circle of the ring-shaped stiffener 24 is aligned with the center of the temporary rest table 204.

In the temporarily resting step, first, the delivery mechanism 206 is actuated to position the center of the inner circumferential circle of the ring-shaped stiffener 24 into alignment with the center of the annular support 226 of the temporary rest table 204 and bring the outer circumferential excess region 20 of the face side 4a of the wafer 4 into contact with the upper surface of the annular support 226 of the temporary rest table 204, and also to bring the lower surface of the frame 64 into contact with the upper surface of the frame support 228 of the temporary rest table 204. At this time, although the face side 4a of the wafer 4 faces downwardly, since the device region 18 is positioned over the cavity 230 in the temporary rest table 204, the devices 14 do not contact the temporary rest table 204 and hence are prevented from being damaged thereby.

The wafer holder 202a stops applying the suction force to the wafer 4, and the frame holder 202b stops applying the suction force to the frame 64. The frame unit unloading mechanism 192 transfers the frame unit U to the temporary rest table 204. The temporarily resting step is carried out as described above.

In the temporarily resting step, after the frame unit unloading mechanism 192 has transferred the frame unit U to the temporary rest table 204, it is preferable to energize the heater of the frame support 228 to heat the tape 96 of the frame unit U temporarily placed on the temporary rest table 204. When heated, the tape 96 is softened into intimate contact with the base of the ring-shaped stiffener 24 of the wafer 4.

After the temporarily resting step, a cutting step is carried out to rotate the frame unit U around the center of the inner circumferential circle of the ring-shaped stiffener 24 to cut the wafer 4 along the inner circumferential circle of the ring-shaped stiffener 24.

As illustrated in FIGS. 1, 11, and 15, in the cutting step, first, the X-axis movable member 260 and the Z-axis movable member 262 of the first lifting and lowering table 246 of the stiffener removing unit 194 are moved to bring the lower surface of the attractive member 268 into contact with the upper surface of the frame 64 of the frame unit U temporarily placed on the temporary rest table 204.

The position of the attractive member 268 at the time the attractive member 268 contacts the frame 64 has already been established such that the center of rotation of the attractive member 268 is aligned with the center of the temporary rest table 204. Inasmuch as the frame unit U has been temporarily placed on the temporary rest table 204 while the center of the inner circumferential circle of the ring-shaped stiffener 24 is aligned with the center of the temporary rest table 204 in the temporarily resting step, as described above, the center of rotation of the attractive member 268 is aligned with the center of the inner circumferential circle of the ring-shaped stiffener 24 when the attractive member 268 is brought into contact with the frame 64.

Then, a suction force is developed in the suction holes in the attractive member 268 of the first lifting and lowering table 246, enabling the attractive member 268 to hold the frame 64 of the frame unit U under suction. Then, the X-axis movable member 260 and the Z-axis movable member 262 of the first lifting and lowering table 246 are moved to position the frame unit U held under suction by the attractive member 268 above the laser beam applying unit 244. Then, a focused spot of the laser beam LB emitted from the laser beam applying unit 244 is positioned on the inner circumferential circle of the ring-shaped stiffener 24 of the wafer 4 of the frame unit U.

Thereafter, as illustrated in FIG. 14, while the attractive member 268 is being rotated by the electric motor 266 of the first lifting and lowering table 246, i.e., while the frame unit U is being rotated about the center of the inner circumferential circle of the ring-shaped stiffener 24, the laser beam LB emitted from the laser beam applying unit 244 is applied to the inner circumferential circle of the ring-shaped stiffener 24 of the wafer 4. The applied laser beam LB forms a ring-shaped cut groove 256 in the wafer 4 on the inner circumferential circle of the ring-shaped stiffener 24 by way of ablation, thereby cutting the wafer 4 along the inner circumferential circle of the ring-shaped stiffener 24. While the laser beam LB is being applied to the wafer 4, the suction source connected to the suction nozzle 254 is actuated to draw debris given off from the wafer 4 by the ablation into the suction nozzle 254.

The cutting step may be carried out using a dicing apparatus, not illustrated, different from the wafer processing apparatus 2. Specifically, while the frame unit U is being rotated about the center of the inner circumferential circle of the ring-shaped stiffener 24, a cutting blade may cut into the wafer 4 along the inner circumferential circle of the ring-shaped stiffener 24, thereby forming a cut groove along the inner circumferential circle of the ring-shaped stiffener 24 to cut the wafer 4.

After the cutting step, a stiffener removing step is carried out to remove the ring-shaped stiffener 24 severed from the frame unit U. In the stiffener removing step, first, the X-axis movable member 260 and the Z-axis movable member 262 of the first lifting and lowering table 246 of the stiffener removing unit 194 are moved to bring the outer circumferential excess region 20 of the face side 4a of the wafer 4 of the frame unit U supported under suction by the attractive member 268 into contact with the upper surface of the annular support 226 of the temporary rest table 204 and also to bring the lower surface of the frame 64 into contact with the frame support 228 of the temporary rest table 204. Then, the suction force from the attractive member 268 of the first lifting and lowering table 246 is eliminated, allowing the frame unit U to be transferred from the first lifting and lowering table 246 to the temporary rest table 204.

Then, the temporary rest table delivery mechanism 232 positions the temporary rest table 204 that has received the frame unit U in a position below the separator 248 of the stiffener removing unit 194 (see FIG. 11). At this time, the belt conveyor 300 of the disposer 276 has been staying in the standby position. Then, the second lifting and lowering table 272 of the separator 248 is lowered to bring the lower surface of the second lifting and lowering table 272 into contact with the tape 96 on the reverse side 4b of the wafer 4. Then, the suction force is developed on the lower surface of the second lifting and lowering table 272, and, as illustrated in FIG. 18, the inner area of the wafer 4 of the frame unit U is held under suction on the table head 287 of the second lifting and the lowering table 272 while the ring-shaped stiffener 24 is radially outwardly exposed.

Then, the second lifting and lowering table 272 that has held the wafer 4 of the frame unit U under suction is lifted to space the frame unit U away from the temporary rest table 204, and the temporary rest table 204 is moved to a position below the first lifting and lowering table 246. Then, the feeding mechanisms 290 moves the movable members 288, and the Z-axis feeding mechanism 294 moves the support boards 400 to cause the wedge disks 402 with the wedges to act on the outer circumferential surface of the ring-shaped stiffener 24, positioning the wedges of the wedge disks 402 between the tape 96 and the ring-shaped stiffener 24, and to support the frame 64 with the spherical bodies 404b of the frame supports 404, as illustrated in FIG. 19. The belt conveyor 300 of the disposer 276 is moved from the standby position to the retrieval position.

Then, the ultraviolet radiation applying units 270 apply an ultraviolet radiation to the tape 96 affixed to the ring-shaped stiffener 24 to reduce the adhesive power of the tape 96. The electric motor 284 is energized to rotate the frame unit U with the second lifting and lowering table 272 with respect to the separating unit 274. The ionizer 406 applies ionized air to the frame unit U. As illustrated in FIG. 20, the ring-shaped stiffener 24 is now separated from the frame unit U, and electrostatic charges generated when the ring-shaped stiffener 24 is separated are not left in the frame unit U. The ring-shaped stiffener 24 drops off from the frame unit U onto the belt conveyor 300 and is delivered by the belt conveyor 300 and retrieved in the dust box 302. When the ring-shaped stiffener 24 is separated, the separating unit 274 may be rotated with respect to the frame unit U.

After the stiffener removing step, a stiffener-free frame unit unloading step is carried out to unload a stiffener-free frame unit U' that is free of the ring-shaped stiffener 24 from the stiffener removing unit 194.

In the stiffener-free frame unit unloading step, first, the belt conveyor 300 of the disposer 276 of the stiffener removing unit 194 is moved from the retrieval position to the standby position. Then, the frame holder 306 of the inverting mechanism 308 (see FIG. 21) of the stiffener-free frame unit unloading mechanism 196 is positioned below the stiffener-free frame unit U' that is held under suction on the second lifting and lowering table 272.

Then, the arm 318 with the suction pads 326 of the frame holder 306 facing upwardly is lifted to bring the suction pads 326 into contact with the lower surface of the frame 64 of the stiffener-free frame unit U' that is supported on the second lifting and lowering table 272 and has the face side 4a of the wafer 4 facing downwardly.

Then, the suction force is developed in the suction pads 326 of the frame holder 306, enabling the suction pads 326 to hold the frame 64 of the stiffener-free frame unit U' under suction. Then, the second lifting and lowering table 272 stops applying the suction force to the stiffener-free frame unit U'. The stiffener-free frame unit U' is now transferred from the second lifting and lowering table 272 of the stiffener removing unit 194 to the frame holder 306 of the stiffener-free frame unit unloading mechanism 196.

After the stiffener-free frame unit unloading step, a stiffener-free frame unit storing step is carried out to store the stiffener-free frame unit U' unloaded by the stiffener-free frame unit unloading mechanism 196.

In the stiffener-free frame unit storing step, first, the inverting mechanism 308 of the stiffener-free frame unit unloading mechanism 196 is turned upside down, turning the stiffener-free frame unit U' held under suction by the frame holder 306 upside down. The stiffener-free frame unit U' is now positioned beneath the frame holder 306, with the face side 4a of the wafer 4 being oriented upwardly.

Then, the Y-axis movable member 316 and the arm 318 of the inverting mechanism 308 are moved to bring the stiffener-free frame unit U' into contact with the upper surfaces of the support plates 328 of the stiffener-free frame unit support 310. At this time, the interval between the support plates 328 has been reduced by the interval adjusting mechanism to the extent that the support plates 328 are held in intimate contact with each other. Then, the frame holder 306 stops applying the suction force to the stiffener-free frame unit U', placing the stiffener-free frame unit U' onto the support plates 328. Then, the heaters combined with the respective support plates 328 are energized to heat the tape 96 of the stiffener-free frame unit U', thereby eliminating slack and wrinkles that may have been caused in the tape 96 upon the removal of the ring-shaped stiffener 24. Then, the frame holder 306 holds the stiffener-free frame unit U' under suction and lifts the stiffener-free frame unit U' again.

Then, the interval adjusting mechanism increases the interval between the support plates 328, and thereafter, the stiffener-free frame unit U' is placed on the upper surfaces of the support plates 328. As illustrated in FIG. 23, the presser 338 of the pusher 312 presses the stiffener-free frame unit U' supported on the stiffener-free frame unit support 310 into the frame cassette 198 placed on the frame cassette table 200, thereby storing the stiffener-free frame unit U' in the frame cassette 198.

According to the illustrated embodiment, as described above, an image of the ring-shaped stiffener 24 is captured, the center of the inner circumferential circle of the ring-shaped stiffener 24 is set on the basis of the captured image, and a cut groove is formed in the wafer 4 along the inner circumferential circle of the ring-shaped stiffener 24 while the frame unit U is being rotated about the set center of the inner circumferential circle of the ring-shaped stiffener 24. Consequently, the wafer 4 can be cut along the inner circumferential circle of the ring-shaped stiffener 24, appropriately removing the ring-shaped stiffener 24 from the wafer 4.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a wafer, comprising:
   a frame preparing step of preparing a ring-shaped frame having an opening for accommodating a wafer therein;
   a wafer preparing step of preparing a wafer having a protrusive ring-shaped stiffener on a reverse side thereof in an outer circumferential excess region thereof;
   a frame unit producing step of producing a frame unit by affixing a tape to the frame and the reverse side of the wafer;
   a center setting step of capturing an image of the ring-shaped stiffener and setting a center of an inner circumferential circle of the ring-shaped stiffener on a basis of the captured image;
   a cutting step of rotating the frame unit around the center of the inner circumferential circle of the ring-shaped stiffener to cut the wafer along the inner circumferential circle of the ring-shaped stiffener; and
   a stiffener removing step of removing the ring-shaped stiffener severed from the frame unit.

2. The method of processing a wafer according to claim 1, further comprising:
   a step of capturing an image of a face side of the wafer that corresponds to the ring-shaped stiffener, inspecting whether there is a device or not in a region where the wafer is to be cut in order to remove the ring-shaped stiffener, and stopping processing the wafer if there is a device in the region.

3. The method of processing a wafer according to claim 1,
   wherein the center setting step includes a step of stopping processing the wafer if a region where the ring-shaped stiffener and the tape are not held in intimate contact with each other is detected.

4. A method of processing a wafer, comprising:
   a frame unit producing step of producing a frame unit by affixing a tape to a frame and a reverse side of the wafer, the frame being a ring-shaped frame having an opening for accommodating the wafer therein, the wafer having a protrusive ring-shaped stiffener on a reverse side thereof in an outer circumferential excess region thereof, the protrusive ring-shaped stiffener being part of the wafer;
   capturing an image of the ring-shaped stiffener;
   setting a center of an inner circumferential circle of the ring-shaped stiffener on a basis of the captured image;
   rotating the frame unit around the center of the inner circumferential circle of the ring-shaped stiffener and cutting the wafer along the inner circumferential circle of the ring-shaped stiffener; and
   removing the ring-shaped stiffener severed from the frame unit.

5. The method of processing a wafer according to claim 4, further comprising:
   capturing an image of a region of a face side of the wafer that corresponds to the region of the ring-shaped stiffener on the reverse side of the wafer;
   inspecting whether there is a device or not in a region where the wafer is to be cut in order to remove the ring-shaped stiffener; and
   stopping processing the wafer if there is a device detected in the region where the wafer is to be cut in order to remove the ring-shaped stiffener.

6. The method of processing a wafer according to claim 5, wherein a device has been detected in the region where the wafer is to be cut in order to remove the ring-shaped stiffener and the processing of the wafer has been stopped; thereafter,
grinding the ring-shaped stiffener to reduce the width of the ring-shaped stiffener in order to keep a device from overlapping the ring-shaped stiffener.

7. The method of processing a wafer according to claim 6, wherein after grinding the ring-shaped stiffener to reduce the width of the ring-shaped stiffener, no device resides in the region where the wafer is to be cut in order to remove the ring-shaped stiffener.

8. The method of processing a wafer according to claim 4 further comprising:
stopping processing of the wafer if a region is detected where the ring-shaped stiffener and the tape were supposed to have been affixed to each other are not in intimate contact with each other.

9. The method of processing a wafer according to claim 8 wherein the ring-shaped stiffener and the tape are not in intimate contact with each other if there is a clearance between the ring-shaped stiffener and the tape.

10. The method of processing a wafer according to claim 4 wherein the wafer has on a face side thereof a device region where a plurality of devices are disposed and an outer circumferential excess region surrounding the device region that extends radially inwardly of the outer circumferential excess region.

11. The method of processing a wafer according to claim 10, further comprising:
capturing an image of a region of the face side of the wafer that corresponds to the region of the ring-shaped stiffener on the reverse side of the wafer;
inspecting whether there is a device or not in a region where the wafer is to be cut in order to remove the ring-shaped stiffener; and
stopping processing the wafer if there is a device detected in the region where the wafer is to be cut in order to remove the ring-shaped stiffener.

12. The method of processing a wafer according to claim 11, wherein a device has been detected in the region where the wafer is to be cut in order to remove the ring-shaped stiffener and the processing of the wafer has been stopped; thereafter,
grinding the ring-shaped stiffener to reduce the width of the ring-shaped stiffener in order to keep a device from overlapping the ring-shaped stiffener.

13. The method of processing a wafer according to claim 12, wherein after grinding the ring-shaped stiffener to reduce the width of the ring-shaped device stiffener, no resides in the region where the wafer is to be cut in order to remove the ring-shaped stiffener.

14. The method of processing a wafer according to claim 4, wherein cutting the wafer along the inner circumferential circle of the ring-shaped stiffener comprises forming a ring-shaped cut groove in the wafer along the ring-shaped stiffener by way of ablation.

15. The method of processing a wafer according to claim 14, wherein removing the ring-shaped stiffener severed from the frame unit comprises applying an ultraviolet radiation to a region radially outward of the cut groove, to locally reduce the adhesive power of the tape.

16. The method of processing a wafer according to claim 4, wherein removing the ring-shaped stiffener severed from the frame unit comprises separating the ring-shaped stiffener from the wafer along the cut groove.

17. The method of processing a wafer according to claim 4, wherein cutting the wafer along the inner circumferential circle of the ring-shaped stiffener comprises applying a laser beam to the wafer along the inner circumferential circle of the ring-shaped stiffener in the outer circumferential excess region of the wafer to form a cut groove in the wafer.

18. The method of processing a wafer according to claim 4,
wherein capturing an image of the ring-shaped stiffener comprises:
capturing an image of at least three portions of the inner circumferential circle of the ring-shaped stiffener; and
measuring the coordinates of the at least three portions of the inner circumferential circle of the ring-shaped stiffener on the basis of the captured image; and
wherein setting a center of an inner circumferential circle of the ring-shaped stiffener on a basis of the captured image comprises:
detecting the coordinates of the center of the inner circumferential circle of the ring-shaped stiffener on the basis of the measured coordinates of the at least three portions; and
wherein the detected coordinates of the center of the inner circumferential circle of the ring-shaped stiffener are set as the center of the inner circumferential circle of the ring-shaped stiffener.

* * * * *